(12) United States Patent
O et al.

(10) Patent No.: US 11,281,397 B2
(45) Date of Patent: Mar. 22, 2022

(54) STACKED MEMORY DEVICE PERFORMING FUNCTION-IN-MEMORY (FIM) OPERATION AND METHOD OF OPERATING THE SAME

(71) Applicant: SAMSUNG ELECTRONICS CO., LTD., Suwon-si (KR)

(72) Inventors: Seongil O, Suwon-si (KR); Kyomin Sohn, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 58 days.

(21) Appl. No.: 17/009,992

(22) Filed: Sep. 2, 2020

(65) Prior Publication Data

US 2021/0263671 A1    Aug. 26, 2021

(30) Foreign Application Priority Data

Feb. 20, 2020 (KR) .................. 10-2020-0021140

(51) Int. Cl.
*G06F 3/06* (2006.01)
*H01L 25/065* (2006.01)

(52) U.S. Cl.
CPC .......... *G06F 3/0655* (2013.01); *G06F 3/061* (2013.01); *G06F 3/0604* (2013.01); *G06F 3/0659* (2013.01); *G06F 3/0679* (2013.01); *H01L 25/0657* (2013.01); *H01L 2225/06541* (2013.01)

(58) Field of Classification Search
None
See application file for complete search history.

(56) References Cited

U.S. PATENT DOCUMENTS

| 8,583,896 | B2 | 11/2013 | Cadambi et al. |
| 9,477,636 | B2 | 10/2016 | Walker et al. |
| 9,606,807 | B2 * | 3/2017 | Walker ................. G06F 9/3877 |
| 9,836,277 | B2 | 12/2017 | Guz et al. |
| 9,953,702 | B2 | 4/2018 | Son |
| 9,997,232 | B2 | 6/2018 | Murphy |
| 2014/0040532 | A1 | 2/2014 | Watanabe et al. |

(Continued)

FOREIGN PATENT DOCUMENTS

KR    1020190083103 A    7/2019

*Primary Examiner* — Jane Wei
(74) *Attorney, Agent, or Firm* — Myers Bigel, P.A.

(57) ABSTRACT

A stacked memory device includes a plurality memory semiconductor dies, a plurality of through silicon vias, a function-in-memory (FIM) front-end circuit and a plurality of FIM back-end circuits. The buffer semiconductor die is configured to communicate with a host device. The memory semiconductor dies are stacked on the buffer semiconductor die, and include a plurality of memory banks. The through-silicon vias electrically connect the buffer semiconductor die and the memory semiconductor dies. The FIM front-end circuit receives a plurality of FIM instructions for a FIM operation from the host device, and stores the FIM instructions. The FIM operation includes data processing based on internal data read from the memory banks. The FIM back-end circuits are respectively included in the memory semiconductor dies. The FIM back-end circuits perform the FIM operation corresponding to the plurality of FIM instructions stored in the FIM front-end circuit under control of the FIM front-end circuit.

19 Claims, 37 Drawing Sheets

(56) References Cited

U.S. PATENT DOCUMENTS

2018/0074958 A1* 3/2018 Jayasena ............ G06F 12/0815
2019/0043560 A1   2/2019   Sumbul et al.
2019/0172512 A1   6/2019   Oh et al.
2019/0206460 A1   7/2019   O et al.

* cited by examiner

FIG. 7A

Row Commands Truth Table

| Function | Symbol | Clock Cycle | R[0] | R[1] | R[2] | R[3] | R[4] | R[5] |
|---|---|---|---|---|---|---|---|---|
| Row No Operation | RNOP | Rising | H | H | H | V | V | V |
| | | Falling | V | V | PAR | V | V | V |
| Activate | ACT | Rising | L | H | RA14/SID | BA0 | BA1 | BA2 |
| | | Falling | RA11 | RA12 | PAR | BA4 | RA13 | BA3 |
| | | Rising | RA5 | RA6 | RA7 | RA8 | RA9 | RA10 |
| | | Falling | RA0 | RA1 | PAR | BA2 | RA3 | RA4 |
| Precharge | PRE | Rising | H | H | L | BA0 | BA1 | BA2 |
| | | Falling | V | V/SID | PAR | BA4 | L | BA3 |

FIG. 7B

Column commands Truth Table

| Function | Symbol | Clock Cycle | C[0] | C[1] | C[2] | C[3] | C[4] | C[5] | C[6] | C[7] |
|---|---|---|---|---|---|---|---|---|---|---|
| Column No Operation | CNOP | Rising | H | H | H | V | V | V | V | V |
| | | Falling | V | V | PAR | V | V | V | V | V |
| Read | RD | Rising | H | L | H | L | BA0 | BA1 | BA2 | BA3 |
| | | Falling | V/SID | CA1 | PAR | CA2 | CA3 | CA4 | CA5 | BA4 |
| Write | WR | Rising | H | L | L | L | BA0 | BA1 | BA2 | BA3 |
| | | Falling | V/SID | CA1 | PAR | CA2 | CA3 | CA4 | CA5 | BA4 |

FIG. 11

FIM INSTRUCTION QUEUE

| CMD (HOST→MEM) | INSTR | DST | SRC1 | SRC2 | SRC3 | MASK | FIM OPERATION DESCRIPTION | RDP | WDP |
|---|---|---|---|---|---|---|---|---|---|
| RD | MAC (multiply-add) | REGx | IOSA | REGy | REGx | 000000: all alu operation ~ 111111: single alu operation | REGx=IOSA*REGy+REGx | BANK->ALU | DISABLE |
| RD | | REGx | REGy | REGz | REGx | | REGx=REGy*REGz+REGx | DISABLE | DISABLE |
| WR | | REGx | DBUS | REGy | REGx | | REGx=DBUS*REGy+REGx | DISABLE | DBUS->ALU |
| RD | MUL (multiply) | REGx | IOSA | REGy | | | REGx=IOSA*REGy | BANK->ALU | DISABLE |
| RD | | REGx | REGy | REGz | | | REGx=REGy*REGz | DISABLE | DISABLE |
| WR | | REGx | REGy | DBUS | | | REGx=REGy*DBUS | DISABLE | DBUS->ALU |
| RD | ADD/SUB | REGx | IOSA | REGy | | | REGx=IOSA+REGy | BANK->ALU | DISABLE |
| RD | | REGx | REGy | REGz | | | REGx=REGy+REGz | DISABLE | DISABLE |
| WR | | REGx | REGy | DBUS | | | REGx=REGy+DBUS | DISABLE | DBUS->ALU |
| RD | LOAD | REGx | IOSA | | | | REGx=BANK | BANK->REG | DISABLE |
| WR | STORE | WRDRV | REGx | | | | BANK=REGx | DISABLE | REG->BANK |
| RD | MOV | DBUS | REGx | | | | DBUS=REGx | REG->DBUS | DISABLE |
| WR | MOV | REGx | DBUS | | | | REGx=DBUS | DISABLE | REG->ALU |
| RD | JUMP | | | | | | PCNT=JUMP TARGET | DISABLE | DISABLE |

FIG. 12

| COMPONENT | SIGNAL |
|---|---|
| FIM CONTROLLER (SFC) | mb_en |
| | bnk_dis |
| | alu_en |
| | rst |
| | in_ctrl |
| | out_ctrl |
| INSTRUCTION DECODER | instr |
| ALU CONTROLLER (SFD) | dbus_dis |
| | bnk_rd_dis |
| | bnk_wr_dis |
| | dbmux ctrl |
| | per_alu_en[0:15] |
| | inmux_ctrl |
| | alu_ctrl |
| | reg_ctrl |

FIG. 16A

FIM INSTRUCTION SEQUENCE

| INDEX | INSTR | DST | SRC1 | SRC2 | SRC3 | MASK |
|---|---|---|---|---|---|---|
| 0 | MOV | REG0 | DBUS | | | 000000 |
| 1 | MAC | REG32 | IOSA | REG0 | REG32 | 000000 |
| 2 | MOV | DBUS | REG32 | | | 110000 |
| 3 | MOV | DBUS | REG32 | | | 110001 |

FIG. 17A

FIM INSTRUCTION SEQUENCE

| INDEX | INSTR | DST | SRC1 | SRC2 | SRC3 | MASK |
|---|---|---|---|---|---|---|
| 0 | MOV | REG0 | DBUS | | | 000000 |
| 1 | MAC | REG32 | IOSA | REG0 | REG32 | 000000 |
| 2 | STORE | WRDRV | REG32 | | | 000000 |

FIG. 18A

FIM INSTRUCTION SEQUENCE

| INDEX | INSTR | DST | SRC1 | SRC2 | SRC3 | MASK |
|---|---|---|---|---|---|---|
| 0 | MOV | REG0 | DBUS | | | |
| 1 | MAC | REG32 | IOSA | REG0 | REG32 | |
| 2 | MOV | DBUS | REG32 | | | |

FIG. 21

| CMD (HOST→MEM) | INSTR | DST | SRC1 | SRC2 | SRC3 | MASK |
|---|---|---|---|---|---|---|
| | MAC (multiply-add) | REG | IOSA | REG | REG | |
| | | REG | REG | REG | REG | |
| | | REG | REG | DBUS | REG | |
| NOT USED IN BATCH EXECUTION MODE | MUL (multiply) | REG | IOSA | REG | | REPLACED BY COLUMN ADDRESS |
| | | REG | REG | REG | | |
| | | REG | REG | DBUS | | |
| | ADD/SUB | REG | IOSA | REG | | |
| | | REG | REG | REG | | |
| | | REG | REG | DBUS | | |
| | LOAD | REG | IOSA | | | |
| | STORE | WRDRV | REG | | | |
| | MOV | DBUS | REG | | | |
| | MOV | REG | DBUS | | | |
| | ACT | Bank Address | | Row Address | | |
| | PRE | Bank Address | | | | NOT USED |
| | JUMP | | | | | |

FIG. 22

| COMPONENT | SIGNAL |
|---|---|
| FIMCON (SFC) | mb_en |
| | bnk_dis |
| | alu_en |
| | rst |
| | in_ctrl |
| | out_ctrl |
| | batch_en |
| | DONE |
| FIMDEC | instr |
| CAGEN | CA_IN |
| ALU CONTROLLER (SFD) | dbus_dis |
| | bnk_rd_dis |
| | bnk_wr_dis |
| | dbmux_ctrl |
| | per_alu_en[0:15] |
| | inmux_ctrl |
| | alu_ctrl |
| | reg_ctrl |

FIG. 23A

FIM INSTRUCTION SEQUENCE

| INDEX | INSTR | DST | SRC1 | SRC2 | SRC3 | MASK |
|---|---|---|---|---|---|---|
| 0 | ACT | bank0 | | row1 | | |
| 1 | LOAD | REG0 | IOSA | | | 000000 |
| 2 | PRE | bank0 | | | | |
| 3 | ACT | bank0 | | row2 | | |
| 4 | MAC | REG32 | IOSA | REG0 | REG32 | 000000 |
| 5 | PRE | bank0 | | row2 | | |
| 6 | ACT | bank0 | | row3 | | |
| 7 | STORE | IOSA | REG32 | | | 000000 |
| 8 | PRE | bank0 | | | | |

FIG. 24A

FIM INSTRUCTION SEQUENCE

| INDEX | INSTR | DST | SRC1 | SRC2 | SRC3 | MASK |
|---|---|---|---|---|---|---|
| 0 | ACT | bank0 | | row1 | | |
| 1 | LOAD | REG0 | IOSA | | | 000000 |
| 2 | PRE | bank0 | | | | |
| 3 | ACT | bank0 | | row2 | | |
| 4 | MAC | REG32 | IOSA | REG0 | REG32 | 000000 |
| 5 | PRE | bank0 | | | | |
| 6 | ACT | bank0 | | row3 | | |
| 7 | STORE | IOSA | REG32 | | | 000000 |
| 8 | PRE | bank0 | | | | |

# STACKED MEMORY DEVICE PERFORMING FUNCTION-IN-MEMORY (FIM) OPERATION AND METHOD OF OPERATING THE SAME

CROSS-REFERENCE TO RELATED APPLICATION

This U.S. non-provisional application claims priority under 35 USC § 119 to Korean Patent Application No. 10-2020-0021140, filed on Feb. 20, 2020, in the Korean Intellectual Property Office (KIPO), the disclosure of which is incorporated by reference herein in its entirety.

FIELD

Example embodiments relate generally to semiconductor integrated circuits, and more particularly to a stacked memory device performing function-in-memory (FIM) operation and a method of operating a stacked memory device.

BACKGROUND

Memory bandwidth and latency are performance bottlenecks in many processing systems. Memory capacity may be increased through the use of a stacked memory device in which a plurality of semiconductor devices are stacked in a package of a memory chip. The stacked semiconductor dies may be electrically connected through the use of through-silicon vias or through-substrate vias (TSVs). Such stacking technology may increase memory capacity and/or suppress bandwidth and/or latency penalties. Each access of an external device to the stacked memory device involves data communication between the stacked semiconductor dies. In this case, inter-device bandwidth and inter-device latency penalties may occur for each access and thus bandwidth and latency may be increased. Accordingly, the inter-device bandwidth and inter-device latency may have a significant impact on processing efficiency and power consumption of the system when a task of the external device requires multiple accesses to the stacked memory device.

SUMMARY

Some example embodiments provide a stacked memory device that efficiently performs a function-in-memory (FIM) operation or a processing-in-memory (PIM) operation.

Some example embodiments provide a system including a stacked memory device and a method of operating a stacked memory device for efficiently performing the FIM operation.

According to example embodiments, a stacked memory device includes a buffer semiconductor die, a plurality memory semiconductor dies, a plurality of through silicon vias, a function-in-memory (FIM) front-end circuit and a plurality of FIM back-end circuits. The buffer semiconductor die is configured to communicate with a host device. The plurality of memory semiconductor dies are stacked on the buffer semiconductor die, and the plurality of memory semiconductor dies include a plurality of memory banks. The plurality of through-silicon vias electrically connect the buffer semiconductor die and the plurality of memory semiconductor dies. The FIM front-end circuit is configured to receive a plurality of FIM instructions for a FIM operation from the host device and stores the plurality of FIM instructions. The FIM operation includes data processing based on internal data read from the plurality of memory banks. The plurality of FIM back-end circuits are respectively included in the plurality of memory semiconductor dies. The plurality of FIM back-end circuits perform the FIM operation corresponding to the plurality of FIM instructions stored in the FIM front-end circuit under control of the FIM front-end circuit.

According to example embodiments, a system includes a stacked memory device and a host device configured to control the stacked memory device. The stacked memory device includes the buffer semiconductor die, the plurality of memory semiconductor dies, the plurality of through-silicon vias electrically connecting the buffer semiconductor die and the plurality of memory semiconductor dies, the FIM front-end circuit and the plurality of FIM back-end circuits.

According to example embodiments, a method of operating a stacked memory device including a buffer semiconductor die configured to communicate with a host device and a plurality of memory semiconductor dies including a plurality of memory banks is provided. The buffer semiconductor die and the plurality of memory semiconductor dies are stacked. The method includes transferring a plurality of function-in-memory (FIM) instructions for a FIM operation from a host device to a stacked memory device, the FIM operation including data processing based on internal data read from a plurality of memory banks, storing the plurality of FIM instructions in a FIM front-end circuit included on a buffer semiconductor die or a plurality of memory semiconductor dies, and performing the FIM operation corresponding to the FIM instructions stored in the FIM front-end circuit under control of the FIM front-end circuit, using a plurality of FIM back-end circuits respectively included in the plurality of memory semiconductor dies.

The stacked memory device, the system and the method according to example embodiments may reduce power consumption and latency of the stacked memory device and the system by performing memory-intensive or data-intensive data processing using the FIM back-end circuit integrated in the stacked memory device.

In addition, the stacked memory device, the system and the method according to example embodiments may reduce data processing time by performing the data processing in parallel using the bank FIM circuits respectively assigned to memory banks.

Further, the stacked memory device, the system and the method according to example embodiments may efficiently perform complex data processing and enhance performance of the system by storing the FIM instructions in the FIM front-end circuit and performing the FIM operation based on the stored FIM instructions.

BRIEF DESCRIPTION OF THE DRAWINGS

Example embodiments of the present disclosure will be more clearly understood from the following detailed description taken in conjunction with the accompanying drawings.

FIGS. 7A and 7B are diagrams illustrating a format of an command-address signal of an HBM device according to example embodiments.

FIG. 11 is a diagram illustrating FIM instructions stored in a stacked memory device according to example embodiments.

FIG. 12 is a diagram illustrating FIM control signals of a stacked memory device according to example embodiments.

FIGS. 16A through 18B are diagrams illustrating example operations of a stacked memory device according to example embodiments.

FIG. 21 is a diagram illustrating FIM instructions stored in a stacked memory device according to example embodiments.

FIG. 22 is a diagram illustrating FIM control signals of a stacked memory device according to example embodiments.

FIGS. 23A through 24B are diagrams illustrating operations of a stacked memory device according to example embodiments.

DETAILED DESCRIPTION

Figure 1:
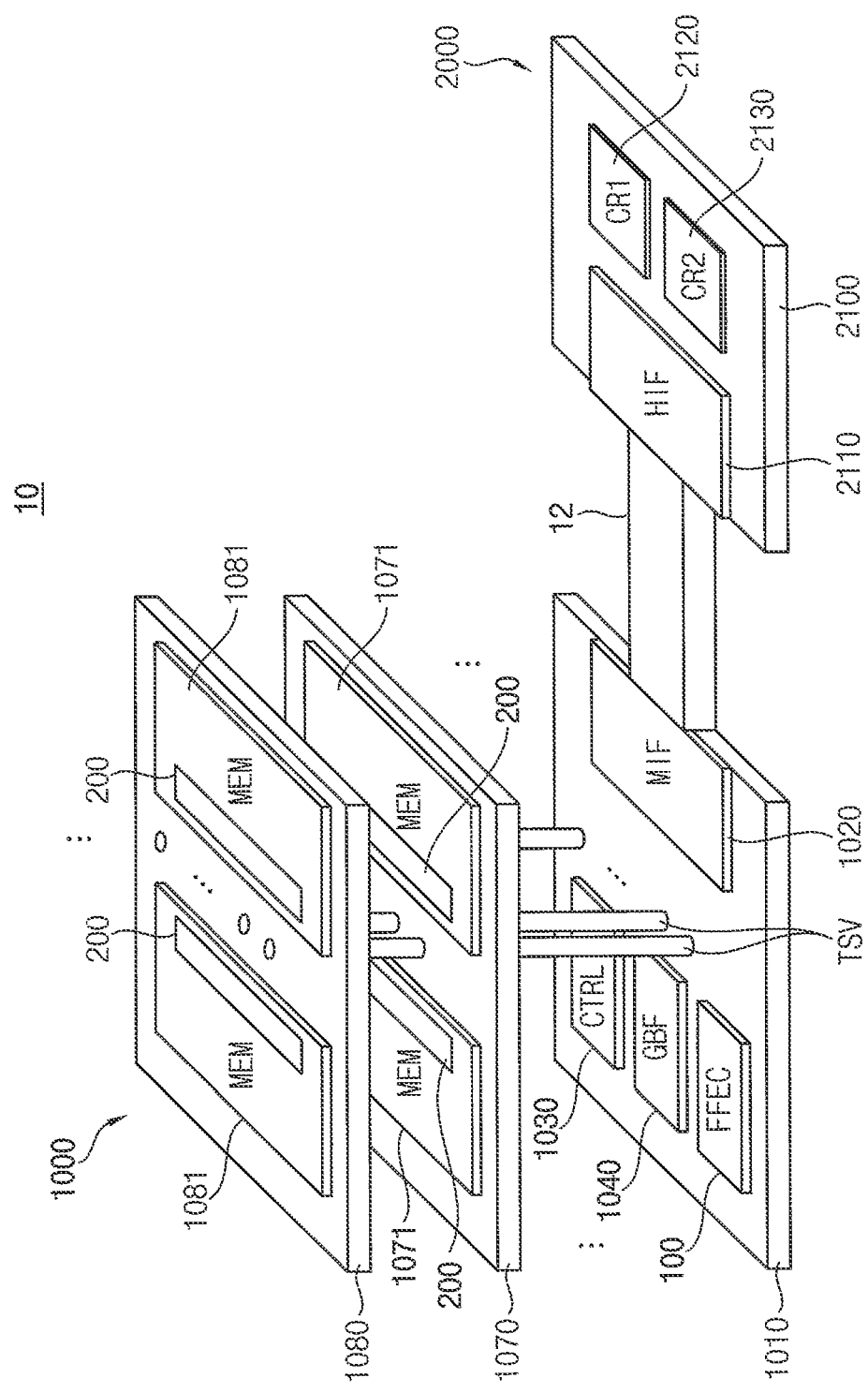
FIG. 1 is a perspective view of a system including a stacked memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is an exploded, perspective view of a system including a stacked memory device according to example embodiments.

Referring to FIG. 1, a system 10 includes a stacked memory device 1000 and a host device 2000.

The stacked memory device 1000 may include a buffer semiconductor die 1010 or a logic semiconductor die 1010 and a plurality of memory semiconductor dies 1070 and 1080 stacked with the buffer semiconductor die 1010. FIG. 1 illustrates a non-limiting example of one buffer semiconductor die and two memory semiconductor dies. Any number of buffer semiconductor dies and memory semiconductor dies may be included. For example, two or more buffer semiconductor dies and one, three or more memory semiconductor dies may be included in the stack structure. In addition, FIG. 1 illustrates a non-limiting example in that the memory semiconductor dies 1070 and 1080 are vertically stacked with the buffer semiconductor die 1010. As will be described below with reference to FIG. 25, the memory semiconductor dies 1070 and 1080 except for the buffer semiconductor die 1010 may be stacked vertically and the buffer semiconductor die 1010 may be electrically connected to the memory semiconductor dies 1070 and 1080 through an interposer and/or a base substrate.

The buffer semiconductor die 1010 may include a memory interface MIF 1020 and a logic circuit to access memory integrated circuits MEM 1071 and 1081 formed in the memory semiconductor dies 1070 and 1080, respectively. The logic circuit may include a control circuit CTRL 1030 and a global buffer GBF 1040. In addition, the buffer semiconductor die 1010 may include a function-in-memory (FIM) front-end circuit FFEC 100 according to example embodiments. In some example embodiments, the FIM front-end circuit 100 may be included in the plurality of memory semiconductor dies 1070 and 1080. The FIM front-end circuit 100 may receive a plurality of FIM instructions for a FIM operation from the host device 2000 and store the plurality of FIM instructions. The operations of the FIM may include data processing based on internal data read from a plurality of memory banks included in the memory semiconductor dies 1070 and 1080.

The memory interface 1020 may perform communication with an external device such as the host device 2000 through an interconnect device 12. The control circuit 1030 may control overall operations of the stacked memory device 1000. The global buffer 1040 may temporarily store data and information exchanged between the host device 2000 and the stacked memory device 1000.

The memory semiconductor dies 1070 and 1080 may include the memory integrated circuits 1071 and 1081, respectively. As described below, each of the memory integrated circuits 1071 and 1081 may include a plurality of memory banks configured to store data. In addition, the memory integrated circuits 1071 and 1081 may include a plurality of FIM back-end circuits 200 according to example embodiments. The plurality of FIM back-end circuits 200 may perform the FIM operation corresponding to the plurality of FIM instructions stored in the FIM front-end circuit 100 under control of the FIM front-end circuit 100.

The host device 2000 may include a host interface HIF 2110 and processor cores CR1 2120 and CR2 2130. The host interface 2110 may perform communication with an external device such as the stacked memory device 1000 through the interconnect device 12.

FIG. 1 illustrates the processing system 10 in accordance with at least one example embodiment of the present inventive concept. The processing system 10 may include any of a variety of computing systems, including a notebook or tablet computer, a desktop computer, a server, a network router, switch, or hub, a computing-enabled cellular phone, a personal digital assistant, and/or the In FIG. 1, the processing system 10 includes the host device 2000 and the stacked memory device 1000 coupled via the interconnect device 12. The processing system 10 may also include a variety of other components, such as one or more display components, storage devices, input devices (e.g., a mouse or keyboard), and/or the like. In some example embodiments, the host device 2000 may be an integrated circuit (IC) package and the stacked memory device 1000 may be an IC package separate from the IC package of the host device 2000. In some example embodiments, the host device 2000 and the stacked memory device 1000 may be an IC package in which a semiconductor die of the host device 2000 and semiconductor dies of the stacked memory device 1000 are electrically connected through an interposer, and/or the like. It is to be understood, however, that the host device 2000 is external with reference to the stacked memory device 1000 and thus may be referred to herein as an "external device".

The host device 2000 may be a device including one or more processor cores 2120 and 2130. For example, the processor cores 2120 and 2130 may include a central processing unit (CPU), a graphic processing unit (GPU), a digital signal processor, and the like or a combination thereof.

The interconnect device 12 may be implemented according to various interconnect architectures or a bus architecture such as a peripheral component interconnect-express (PCI-E) architecture, a hyper-transfer architecture, a quick-path interconnect (QPI) architecture, and the like. The interconnect device 12 includes one or more conduction lines to electrically connect a transceiver circuit in the memory interface 1020 of the stacked memory device 1000 and a transceiver circuit in the host interface 2110 of the host device 2000. The conduction lines may include electrical conduction lines such as traces or cables of a printed circuit board (PCB), optical conduction lines such as optical fibers, or a combination thereof.

The memory integrated circuits 1071 and 1081 in the memory semiconductor dies 1070 and 1080 may include a variety of memory cell architectures, including, but not limited to, volatile memory architectures such as dynamic random access memory (DRAM), thyristor random access memory (TRAM) and static random access memory (SRAM), or non-volatile memory architectures, such as read-only memory (ROM), flash memory, ferroelectric RAM (FRAM), phase change RAM (PRAM), magneto-resistive RAM (MRAM), and the like.

In some example embodiments, a memory controller may be included in the stacked memory device 1000. For example, the memory interface 1020 may include the memory controller. The memory controller may include receivers and line drivers, memory request buffers, scheduling logic, row/column decode logic, refresh logic, data-in and data-out buffers, clock generators, and the like. In some example embodiments, the memory controller may be included in the host device 2000.

The stacked memory device 1000 in FIG. 1 may be implemented in a vertical stacking arrangement whereby power and signaling are transmitted between the buffer semiconductor die 1010 and the memory semiconductor dies 1070 and 1080 using dense through-silicon vias (TSVs) or other vertical interconnects. Although FIG. 1 illustrates the TSVs in a set of centralized rows, the TSVs may be differently dispersed across the floorplans of the buffer semiconductor die 1010, and/or the memory semiconductor dies 1070 and 1080.

Figure 2:
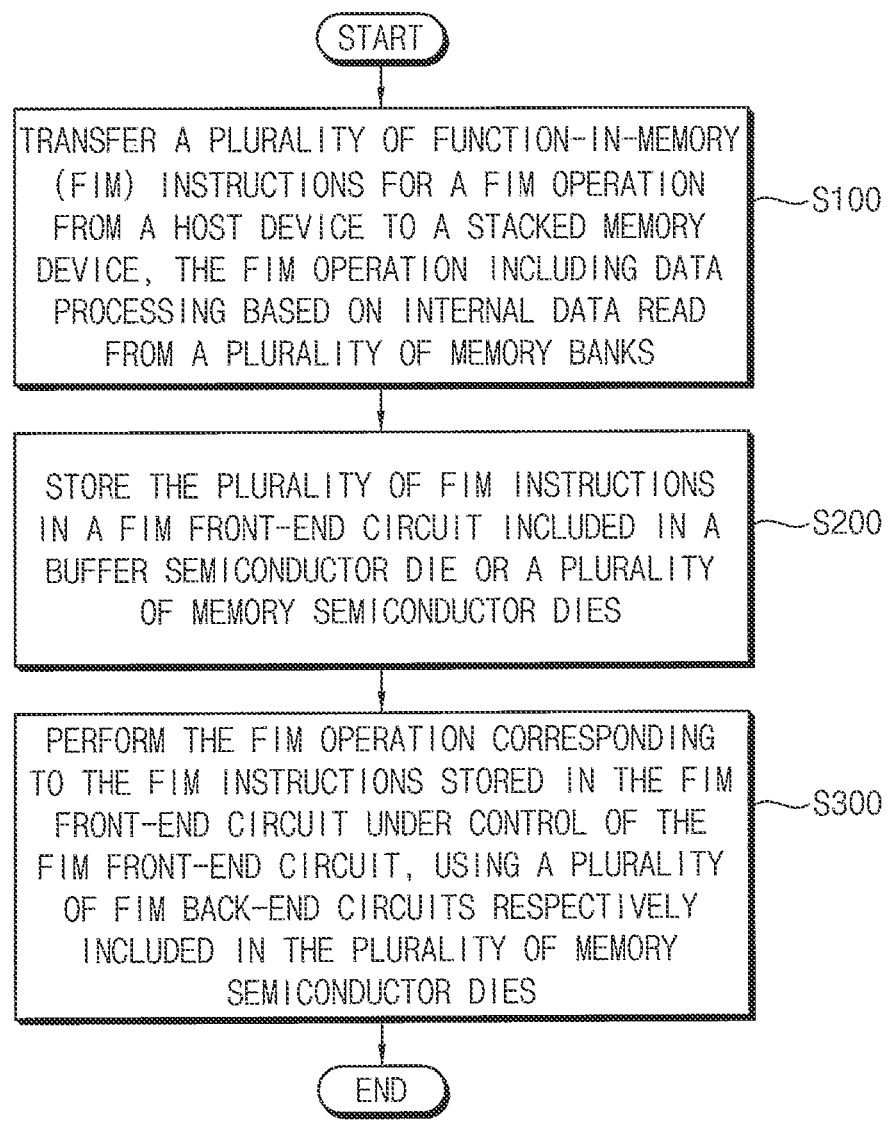
FIG. 2 is a flow chart illustrating a method of operating a stacked memory device according to example embodiments.

FIG. 2 is a flow chart illustrating a method of operating a stacked memory device according to example embodiments.

Referring to FIGS. 1 and 2, the plurality of function-in-memory (FIM) instructions for a FIM operation may be transferred from the host device 2000 to the stacked memory device 1000 where the FIM operation includes data processing based on the internal data read from the plurality of memory banks (S100).

The stacked memory device 1000 may store the plurality of FIM instructions in the FIM front-end circuit 100 included in the buffer semiconductor die 1010 or the plurality of memory semiconductor dies 1070 and 1080 (S200).

The stacked memory device 1000 may perform the FIM operation corresponding to the FIM instructions stored in the FIM front-end circuit 100 under control of the FIM front-end circuit 100, using the plurality of FIM back-end circuits 200 respectively included in the plurality of memory semiconductor dies 1070 and 1080 (S300).

As such, the stacked memory device 1000, the system 10 and the method of operating the stacked memory device 1000 according to example embodiments may reduce power consumption and latency of the stacked memory device 1000 and the system 10 by performing memory-intensive or data-intensive data processing using the FIM back-end circuit 200 integrated in the stacked memory dies 1070 and 1080. In addition, data processing time may be reduced by performing the data processing in parallel using the bank FIM circuits respectively assigned to memory banks. Further, complex data processing may be performed efficiently and performance of the system 10 may be enhanced by storing the FIM instructions in the FIM front-end circuit 100 and performing the FIM operation based on the stored FIM instructions.

Figure 3:
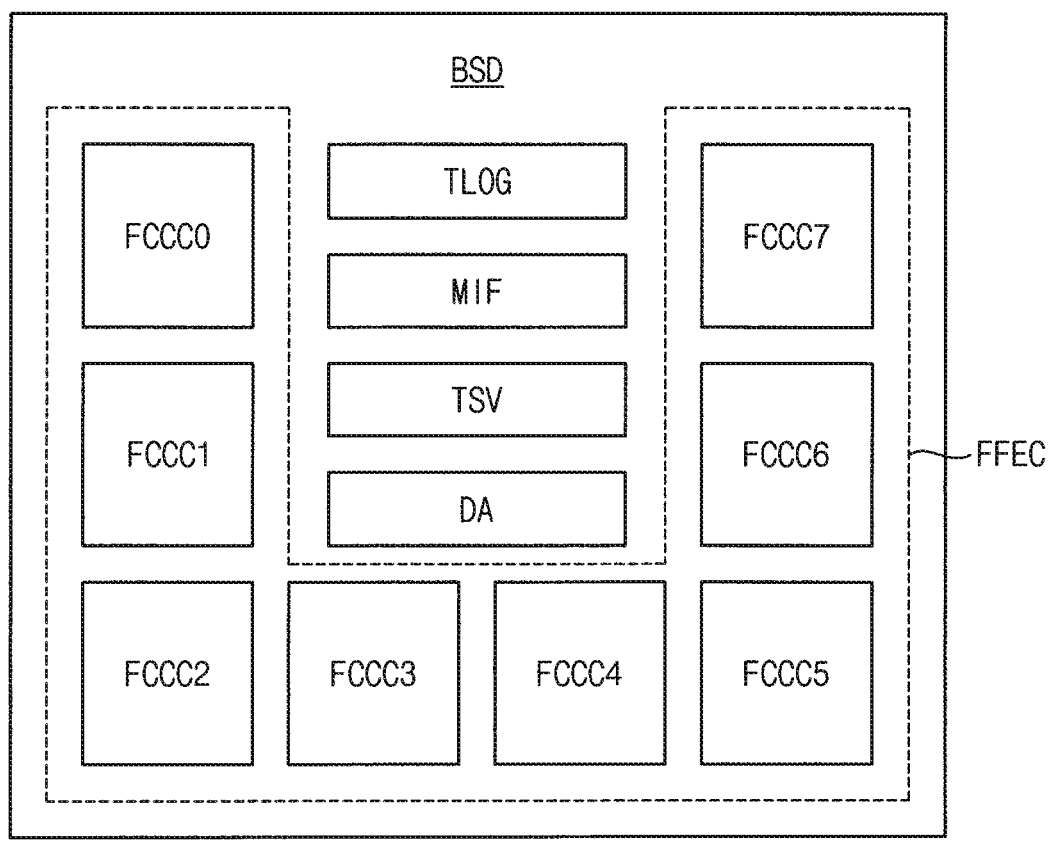
FIG. 3 is a block diagram illustrating a function-in-memory (FIM) front-end circuit included in a stacked memory device according to example embodiments.

FIG. 3 is a block diagram illustrating a function-in-memory (FM) front-end circuit included in a stacked memory device according to example embodiments.

Referring to FIG. 3, a buffer semiconductor die BSD may include a test logic TLOG, a memory interface MIF, through-silicon vias TSV, direct access (DA) terminals, etc.

In some example embodiments, as illustrated in FIG. 2, the FIM front-end circuit FFEC may be formed or included in the buffer semiconductor die BSD. In other example embodiments, as will be described below with reference to FIG. 27, the FIM front-end circuit FFEC may be included in a plurality of memory semiconductor dies.

A plurality of memory banks may form a plurality of channels that may be accessed independently by the host device. In this case, the FIM front-end circuit FFEC may include a plurality of FIM channel control circuits FCCC0~FCCC7 respectively corresponding to the plurality of channels. Each of the FIM channel control circuits FCCC0~FCCC7 may control the FIM operation of memory banks corresponding to each channel of the plurality of channels.

For convenience of illustration and description, FIG. 3 illustrates the eight FIM channel control circuits FCCC0~FCCC7 respectively corresponding to eight channels. The number of FIM channel control circuits may be determined depending on the channel configuration between the stacked memory device and the host device. Even though FIG. 3 illustrates that the FIM channel control circuits FCCC0~FCCC7 are disposed at the edge portions of the buffer semiconductor die BSD, example embodiments are not limited to the illustrated layout.

Figure 4:
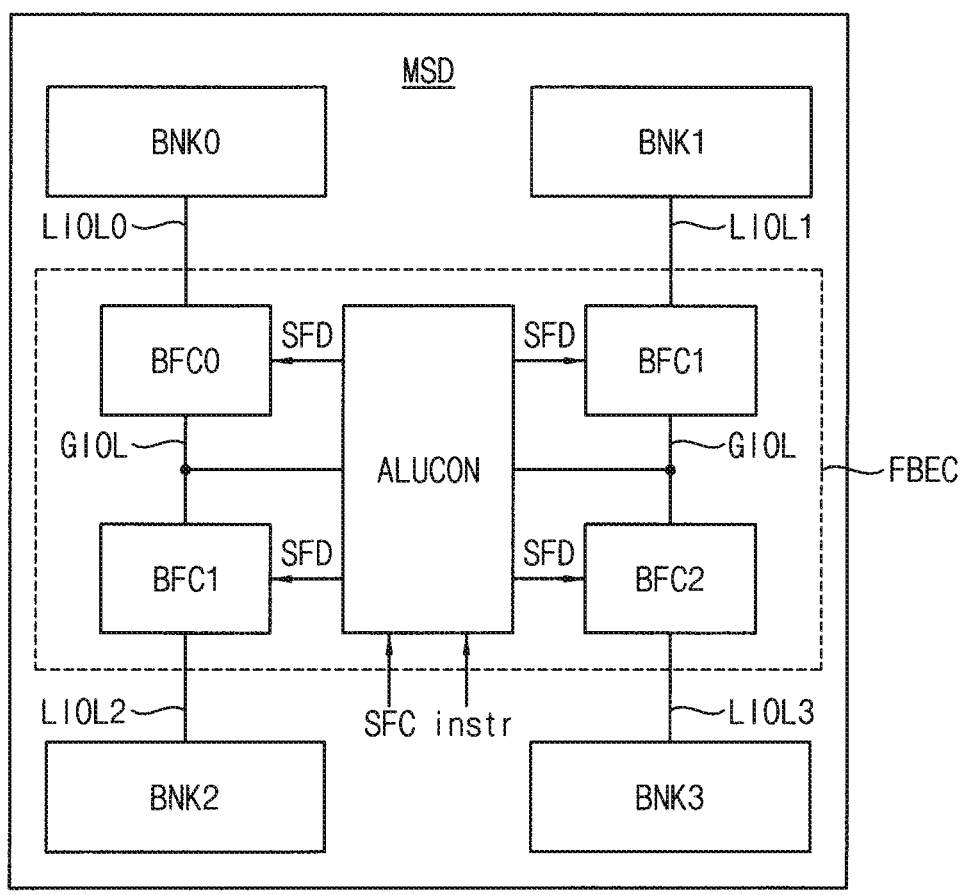
FIG. 4 is a block diagram illustrating a FIM back-end circuit included in a stacked memory device according to example embodiments.

FIG. 4 is a block diagram illustrating a FIM back-end circuit included in a stacked memory device according to example embodiments.

FIG. 4 illustrates a plurality of memory banks BNK0~BNK3 and a FIM back-end circuit FBEC corresponding to one channel, which are formed or included in a mentor semiconductor die MSD. FIG. 4 illustrates four memory banks as an example for convenience of illustration and description. However, the number of memory banks corresponding to one channel may be determined depending on a system configuration. In addition, FIG. 4 illustrates a configuration corresponding to one channel in one memory semiconductor die as an example for convenience of illustration and description. However, memory banks included in one memory semiconductor die may form two or more channels. In this case, two or more FIM back-end circuits corresponding to two or more channels may be included in one memory semiconductor die.

Referring to FIG. 4, a FIM back-end circuit FBEC corresponding to each channel may include a plurality of bank FIM circuits BFC0~BFC3 and an operation controller ALUCON.

The plurality of bank FIM circuits BFC0~BFC3 may be assigned to each of the memory bank BNK0~BNK3 to perform the HIM operation associated with the assigned memory hank. The first through fourth bank FIM circuits BFC0~BFC3 may perform the data processing based on the internal data read from the first through fourth memory banks BNK0~BNK3 and provided through first through fourth local input-output lines LIOL0~LIOL3, respectively. For example, the first bank FIM circuit BFC0 may receive the internal data from the first memory bank BNK0 through the first local input-output lines LIOL0 to perform the data processing based on the internal data. In addition, the first through fourth bank FIM circuits BFC0~BFC3 may control data communication through global input-output lines GIOL.

The operation controller ALUCON may generate FIM die control signals SFD to control the plurality of bank FIM circuits RFC0~BFC3 based on an internal instruction signal instr and FIM channel control signals SFC corresponding to the plurality of FIM instructions. The internal instruction signal instr and the FIM channel control signals SFC may be provided from the corresponding FIM channel control circuit in FIG. 3. The internal instruction signal instr, the FIM channel control signals SFC, and the FIM die control signals SFD will be further described below with reference to FIGS. 8 through 12.

Figure 5:
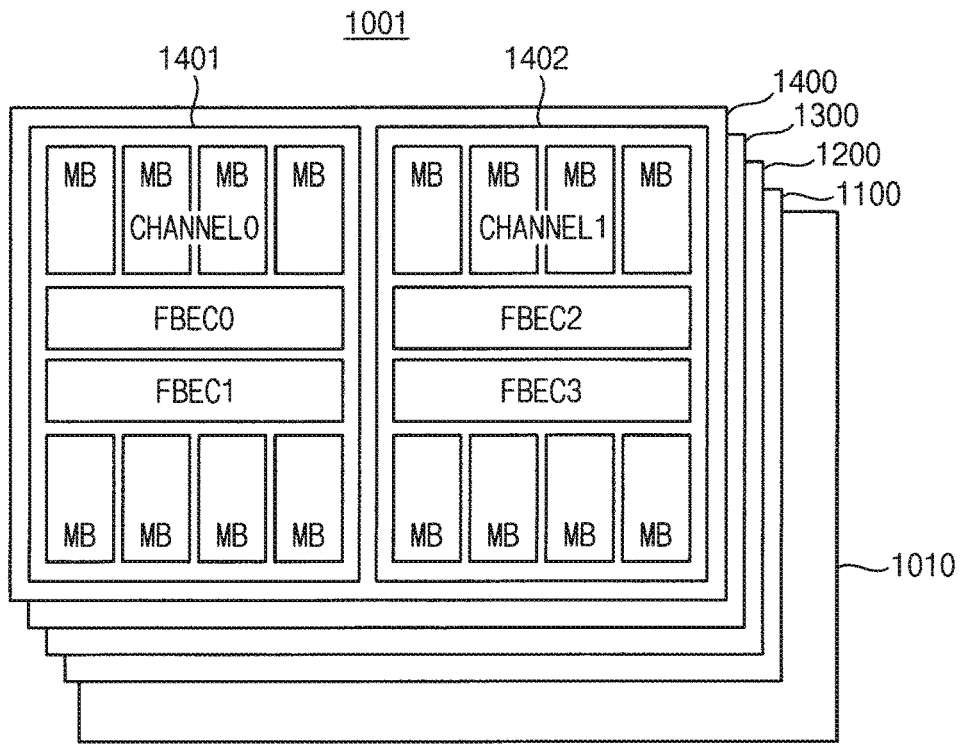
FIG. 5 is a diagram illustrating a high bandwidth memory (HBM) device according to example embodiments.

FIG. 5 is a diagram illustrating a high bandwidth memory (HBM) device according to example embodiments.

Referring to FIG. 5, a HBM device 1001 may include a stack of multiple DRAM semiconductor dies 1100, 1200, 1300 and 1400. The HBM device 1001 of the stack structure may be optimized by a plurality of independent interfaces called channels. Each DRAM stack may support up to 8 channels in accordance with the HBM standards. FIG. 5 shows an example stack containing 4 DRAM semiconductor dies 1100, 1200, 1300 and 1400, and each DRAM semiconductor die supports two channels CHANNEL0 and CHANNEL1. For example, as illustrated in FIG. 5, the fourth memory semiconductor die 1400 may include two memory integrated circuits 1401 and 1402 corresponding to the two channels. Each of the two channels CHANNEL0 and CHANNEL1 may be divided into two pseudo-channels. In this case, one memory semiconductor die includes four FIM back-end circuits FBEC0~FBEC3 respectively corresponding to the four pseudo-channels, that is, the two channels included in the one memory semiconductor die.

Each channel of the HBM device 1001 may provide access to an independent set of DRAM banks. Requests from one channel may not access data attached to a different channel. Channels are independently clocked, and need not be synchronous.

The HBM 1001 may further include a buffer semiconductor die 1010 disposed at bottom of the stack structure to provide signal routing and/or other functions. As described with reference to FIG. 3, the FIM front-end circuit FFEC may be formed in the buffer semiconductor die 1010. The FIM front-end circuit FFEC may include a plurality of FIM channel control circuits respectively corresponding to a plurality of channels.

Figure 6:
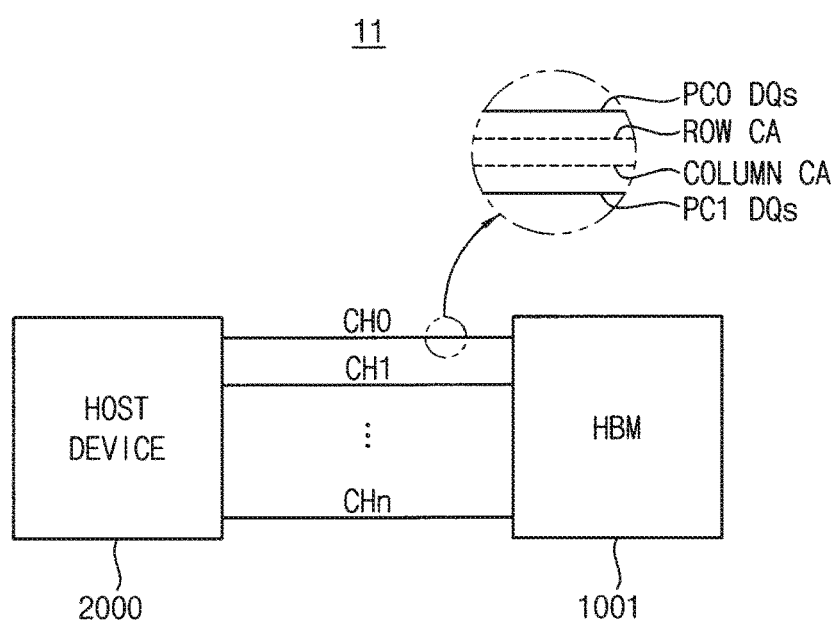
FIG. 6 is a diagram illustrating an example interface of a system including an HBM device according to example embodiments.

FIG. 6 is a diagram illustrating an example interface of a system including an HBM device according to example embodiments.

Referring to FIG. 6, a system 11 may include an HBM device 1001 and a host device 2000 that are connected through a plurality of channels CH0~CHn. Each of the channels CH0~CHn may include two pseudo-channels PC0 and PC1. For example, as illustrated in FIG. 6, signal lines corresponding to one channel CH0 may include data lines PC0 DQs of the first pseudo-channel PC0, data lines PC1 DQs of the second pseudo-channel PC1, and command-address lines CA. The command-address lines CA may include a row command-address lines ROW CA for transferring an active command, a precharge command, etc. and a column command-address lines COLUMN CA for transferring a read command, a write command, etc.

The typical memory channel includes a command-address (CA) interface and a data (DQ) interface, which may be controlled independently of those of other channels. The pseudo-channel may include the independent DQ interface and the shared CA interface as illustrated in FIG. 6. The pseudo-channels may be selected by a time-division scheme, and a respective command and address may be transferred though the pseudo-channels corresponding to the same memory channel. In this disclosure, "channel" indicates "pseudo-channel" that may be controlled independently.

For example, in case of a 4H-HBM device including four stacked memory semiconductor dies, each memory semiconductor die may include two channels or four pseudo-channels, and each pseudo-channel may include 16 memory banks. In other words, each memory semiconductor die may include 64 memory banks, and the 64 memory banks may be divided into four pseudo-channels. In case of the 4H-HBM device, the FIM front-end circuit FFEC may include 16 FIM channel control circuits corresponding to 16 pseudo-channels, and each memory semiconductor die may include 4 ELM back-end circuit FBEC corresponding to 4 pseudo-channels.

FIGS. 7A and 7B are diagrams illustrating an example format of an command-address signal of an FIBM device according to example embodiments.

FIG. 7A illustrates a row no operation command RNOP, an active command ACT or an activate command ACT and a precharge command PRE that are transferred through the row command-address lines ROW CA in FIG. 6. FIG. 7B illustrates a column no operation command CNOP, a read command RD and a write command WR that are transferred through the column command-address lines COLUMN CA in FIG. 6.

Referring to FIGS. 7A and 7B, commands and addresses transferred from the host device to the HBM device may be represented by a combination of row CA signals R[0]~R[5] and column CA signals C[0]~C[7]. 'H' indicates a logic high level, 'L' indicates a logic low level, RA0~RA14 indicate bits of a row address, BA0~BA4 indicate bits of a bank address, 'V' indicates any of the logic high level or the logic low level, CA1~CA5 indicate bits of a column address, SID indicates an identifier of a memory semiconductor die, and PAR indicates a parity bit.

For example, the active command ACT may be transferred during two clock cycles including two rising edges and/or two falling edges, whereas the precharge command PRE, the read command RD and the write command WR may be transferred during one clock cycle. The active command ACT may include the bank address BA0~BA4 and the row address RA0~RA14, the precharge command PRE may include the bank address BA0~BA4, and the read command RD, and the write command WR may include the bank address BA0~BA4 and the column address CA1~CA5.

The combinations of the command-address signal illustrated in FIGS. 7A and 7B are non-limiting examples, and various combinations may be utilized.

The system including the stacked memory device according to example embodiments may operate in at least one of a sequential execution mode and a batch execution mode. In the sequential execution mode, the FIM front-end circuit may execute one FIM instruction among the plurality of FIM instructions stored in the FIM front-end circuit based on one command and one address included in the command-address signal. In the batch execution mode, the FIM front-end circuit may sequentially execute the plurality of FIM instructions stored in the FIM front-end circuit regardless of the command-address signal.

Hereinafter, example embodiments associated with the sequential execution mode will be described with reference to FIGS. 8 through 18B, and example embodiments associated with the batch execution mode will be described with reference to FIGS. 19 through 24B.

Figure 8:
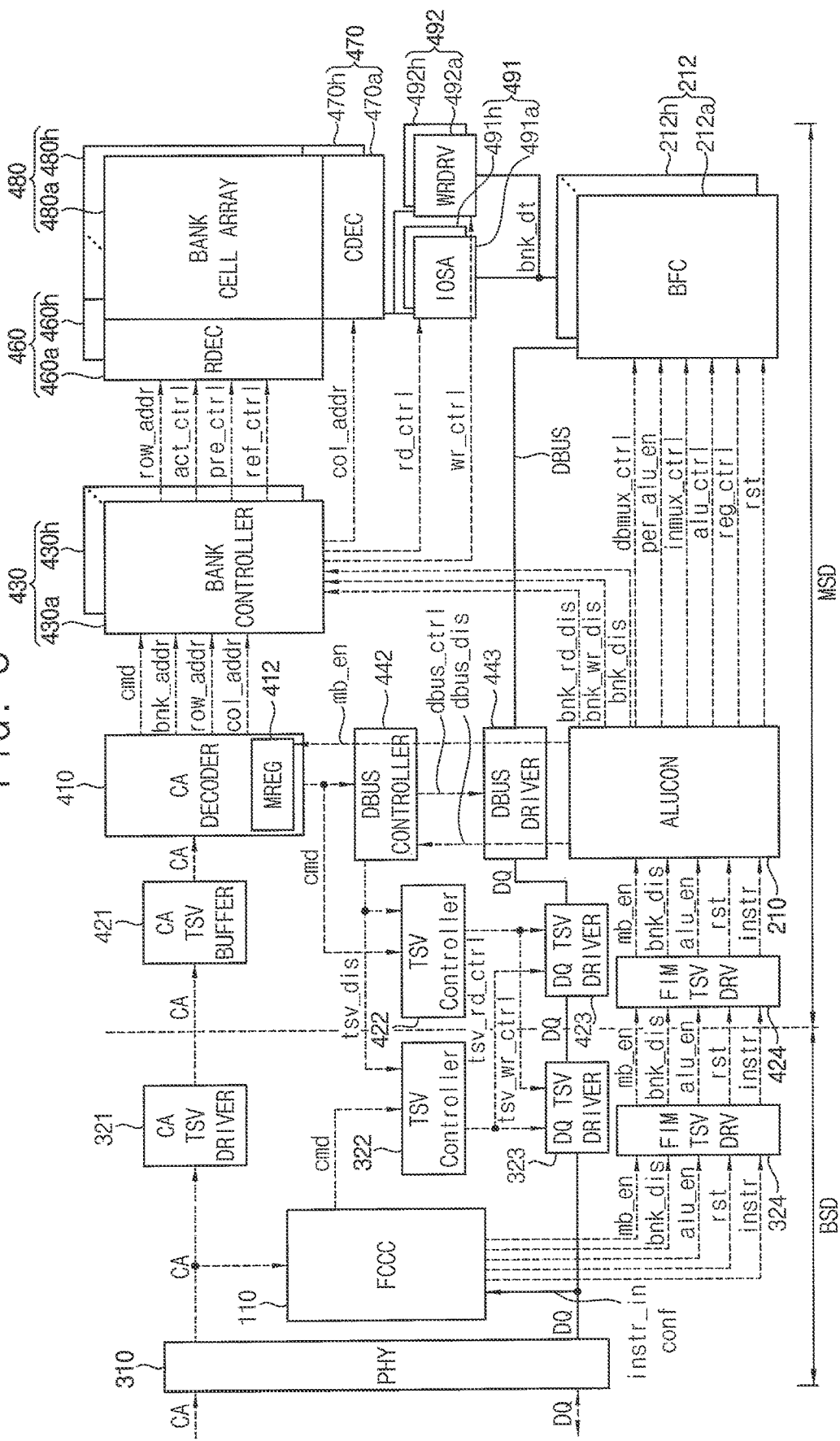
FIG. 8 is a diagram illustrating a stacked memory device according to example embodiments.

FIG. 8 is a diagram illustrating a stacked memory device according to example embodiments.

FIG. 8 illustrates a configuration of buffer semiconductor die BSD and a configuration of a memory semiconductor die MSD that correspond to one channel or one pseudo-channel. A DRAM is described as an example with reference to FIG. 8, and example embodiments may be applied to volatile memory architectures such as DRAM, TRAM and SRAM, or non-volatile memory architectures, such as ROM, flash memory, FRAM, PRAM, MRAM and the like. Even though omitted in FIG. 8, the buffer semiconductor die BSD and the memory semiconductor die MSD may be electrically connected through TSVs and signals may be transferred through the TSVs.

Referring to FIG. 8, the buffer semiconductor die BSD may include a physical layer PHY 310, a FIM channel control circuit FCCC 110, a command-address (CA) TSV driver 321, a TSV controller 322, a data (DQ) TSV driver 323 and a FIM TSV driver 324. The memory semiconductor die MSD may include CA TSV buffer 421, a TSV controller 422, a DQ TSV driver 423, a FIM TSV driver 424, a data bus (DBUS) controller 442, a DBUS driver 443, a CA decoder 410, a bank control circuit 430, a row decoder circuit (RDEC) 460, a column decoder circuit (CDEC) 470, a bank cell array or memory cell array 480, a read-write circuit (IOSA/WRDRV) 491 and 492, a FIM back-end circuit 210 and 212. The FIM back-end circuit 210 and 212 may include an operation controller ALUCON 210 and a plurality of bank FIM circuits (BFC) 212a~212h.

The memory cell array 480 may include a plurality of bank cell arrays 480a~480h. The row decoder circuit 460 may include a plurality of row decoders RDEC 460a~460h respectively connected to the plurality of bank cell arrays 480a~480h. The column decoder circuit 470 may include a plurality of column decoders CDEC 470a~470h respectively connected to the plurality of bank cell arrays 480a~480h. The bank control circuit 430 may include a plurality of bank controllers 430a~430h respectively corresponding to the plurality of bank cell arrays 480a~480h, and the read-write circuit 491 and 492 may include a plurality of input-output sense amplifiers IOSA 491a~491h and a plurality of write drivers WRDRV 492a~492h respectively corresponding to the plurality of bank cell arrays 480a~480h.

The physical layer 310 may receive the command-address signal CA from the host device and transfer the command-address signal CA to the CA decoder 410 through the CA TSV driver 321 and the CA TSV buffer 421. In addition, the physical layer 310 may receive data DQ from the host device to transfer the data DQ to the data bus DBUS through the DQ TSV drivers 323 and 423 and the data bus driver 443, and receive the data DQ from the data bus DBUS to transfer the data DQ to the host device.

The CA decoder 410 may receive the command-address signal CA to generate an internal command signal cmd, a bank address bnk_addr, a row address row_addr and a column address col_addr. The CA decoder 410 may include a mode register circuit MREG 412 to store setting values for controlling the memory semiconductor die MSD. The plurality of bank controllers 430a~430h may be enabled based on the bank address bnk_addr, and the enabled bank controller may generate an active control signal act_ctrl, a precharge control signal pre_ctrl, a refresh control signal ref_ctrl, a read control signal rd_ctrl and a write control signal wr_ctrl based on the internal command signal cmd. The row address row_addr, the active control signal act_ctrl, the precharge control signal pre_ctrl, and the refresh control signal ref_ctrl may be provided to the row decoder 460, the column address col_addr may be provided to the column decoder circuit 470, and the read control signal rd_ctrl and the write control signal wr_ctrl may be provided to the read-write circuit 491 and 492.

The row decoder corresponding to the bank address bnk_addr among the row decoders 460a~460h may decode the row address row_addr to enable a word line corresponding to the row address row_addr. The column decoder corresponding to the bank address bnk_addr among the column decoders 470a~470h may decode the column address col_addr to enable bit lines corresponding to the column address col_addr.

The input-output sense amplifier corresponding to the bank address bnk_addr among the input-output sense amplifiers 491a~491h may output bank data bnk_dt read from the enabled bank cell array through the column decoder. The write driver corresponding to the bank address bnk_addr among the write drivers 492a~492h may write the bank data bnk_dt in the enabled bank cell array through the column decoder.

The data bus controller 442 may generate a data bus control signal dbus_ctrl, and a TSV disable signal tsv_dis based on the internal command signal cmd and a data bus disable signal dbus_dis. The TSV controllers 322 and 422 may generate a TSV read control signal tsv_rd_ctrl and a TSV write control signal tsv_wr_ctrl based on the internal command signal cmd and the TSV disable signal tsv_dis.

The FIM channel control circuit 110 may store a plurality of FIM instructions instr_in based on the command-address signal CA and the data signal DQ from the host device. The plurality of FIM instruction instr_in may be provided through the data signal DQ transferred from the host device. In addition, the FIM channel control circuit (FCCC) 110 may receive configuration information conf transferred through the data signal DQ and store the configuration information conf.

The FIM channel control circuit (FCCC) 110 may decode the plurality of FIM instructions instr_in stored in the FIM channel control circuit 110 to generate an internal instruction signal instr and decode the command-address signal CA transferred from the host device to generate the internal command signal cmd. In addition, the FIM channel control circuit (FCCC) 110 may generate FIM channel control signals SFC based on the configuration information conf stored in the FIM channel control circuit (FCCC) 110. The FIM channel control signals SFC may include a multi-bank enable signal mb_en, a bank disable signal bnk_dis, an operation circuit enable signal alu_en and a reset signal rst.

The operation controller 210 of the FIM back-end circuit 210 and 212 may generate FIM die control signals SFD for controlling the plurality of bank FIM circuits 212a~212h based on the internal instruction signal instr corresponding to the plurality of FIM instructions instr_in stored in the FIM channel control circuit (FCCC) 110. The FIM die control signals SFD may include the data bus disable signal dbus_dis, the bank read disable signal bnk_rd_dis, the bank write disable signal bnk_wr_dis, a data bus multiplexer control signal dbmux_ctrl, an operation circuit control signal alu_ctrl and a register control signal reg_ctrl.

The bank FIM circuits 212a~212h of the FIM back-end circuit 210 and 212 may be assigned respectively to the memory banks to perform the FIM operation associated with the assigned memory bank based on the FIM die control signals SED.

Each of the bank FIM circuits 212a~212h may perform data processing based on the internal data provided from the memory bank through the corresponding input-output sense amplifier. In addition, each of the bank FIM circuits 212a~212h may output the stored data to the data bus DBUS or write the stored data in the memory bank through the corresponding write driver. In addition, each of the bank FIM circuits 212a~212h may store the data received through the data bus DBUS or the corresponding input-output sense amplifier. The above-mentioned FIM operation may include such data processing, write operation, read operation and input-output operation.

Figure 9:
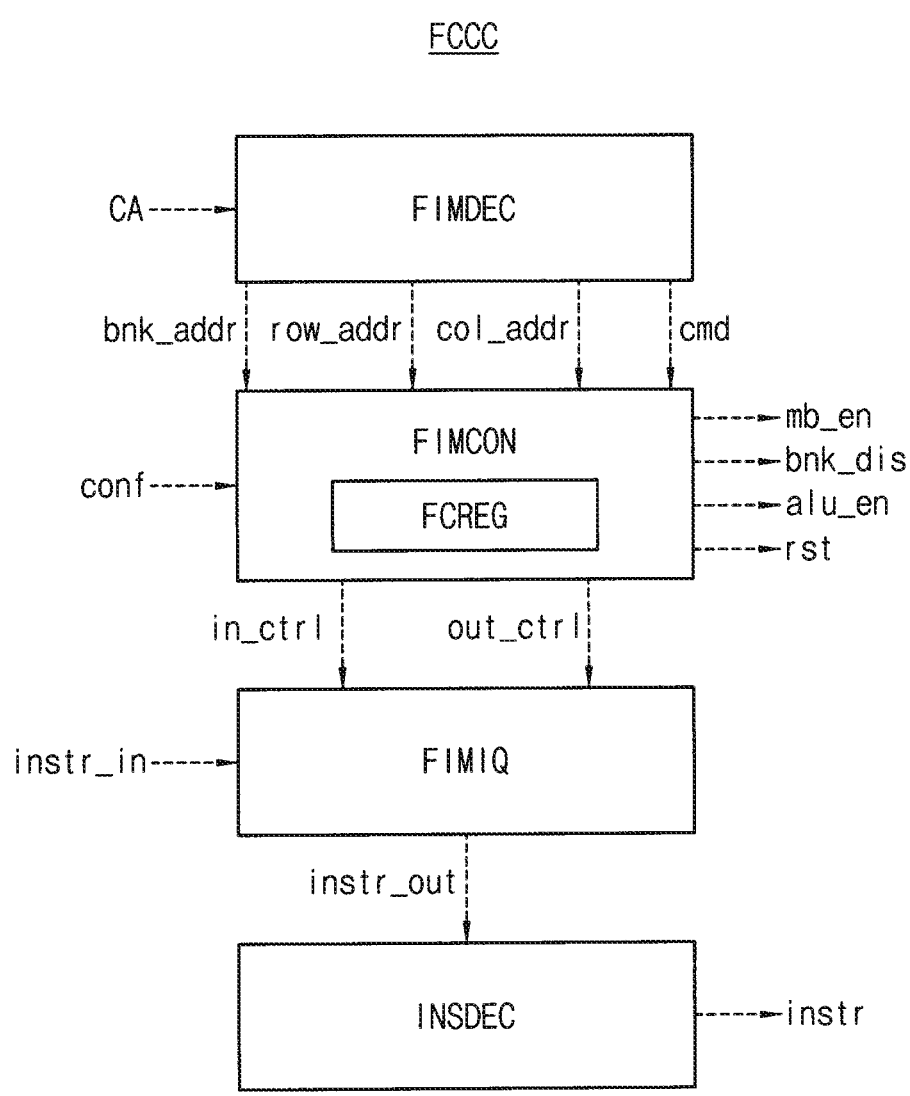
FIG. 9 is a block diagram illustrating a FIM channel control circuit included in the stacked memory device of FIG. 8.

FIG. 9 is a block diagram illustrating an example embodiment of a FIM channel control circuit included in the stacked memory device of FIG. 8.

Referring to FIG. 9, a FIM channel control circuit FCCC corresponding to each channel may include a FEM decoder FIMDEC, a FIM controller FIMCON, a FEM instruction queue FIMIQ and a FIM instruction decoder INSDEC.

The FIM decoder FIMDEC may decode a command-address signal CA transferred from the host device to generate an internal command signal cmd and an internal address signal. The internal address signal may include a bank address bnk_addr, a row address row_addr and a column address col_addr.

The FIM controller FIMCON may generate a queue control signal based on the internal corn and signal cmd and the internal address signal bnk_addr, row_addr and col_addr. The queue control signal may include a queue input control signal in_ctrl and a queue output control signal out_ctrl.

The FIM controller FIMCON may include a FIM control register FCREG configured to store configuration information conf included in the data signal DQ from the host device based on the internal command signal cmd and the internal address signal bnk_addr, row_addr and col_addr. The FIM controller FIMCON may generate FIM channel control signals SFC, that is, the multi-bank enable signal mb_en, the bank disable signal bnk_dis, the operation circuit enable signal alu_en and the reset signal rst to control the FIM back-end circuit corresponding to each channel, based on the configuration information conf stored in the FIM control register FCREG. The FIM control register FCREG may be initialized in response to the reset signal rst.

The FIM instruction queue FIMIQ may store the FIM instructions instr_in included in the data signal DQ transferred from the host device based on the queue input control signal in_ctrl and output stored FIM instructions instr_out based on the queue output control signal out_ctrl.

The FIM instruction decoder INSDEC may decode the FIM instructions instr_out output from the FIM instruction queue FIMIQ to generate an internal instruction signal instr and transfer the internal instruction signal instr to the FIM back-end circuit corresponding to each channel.

Figure 10:
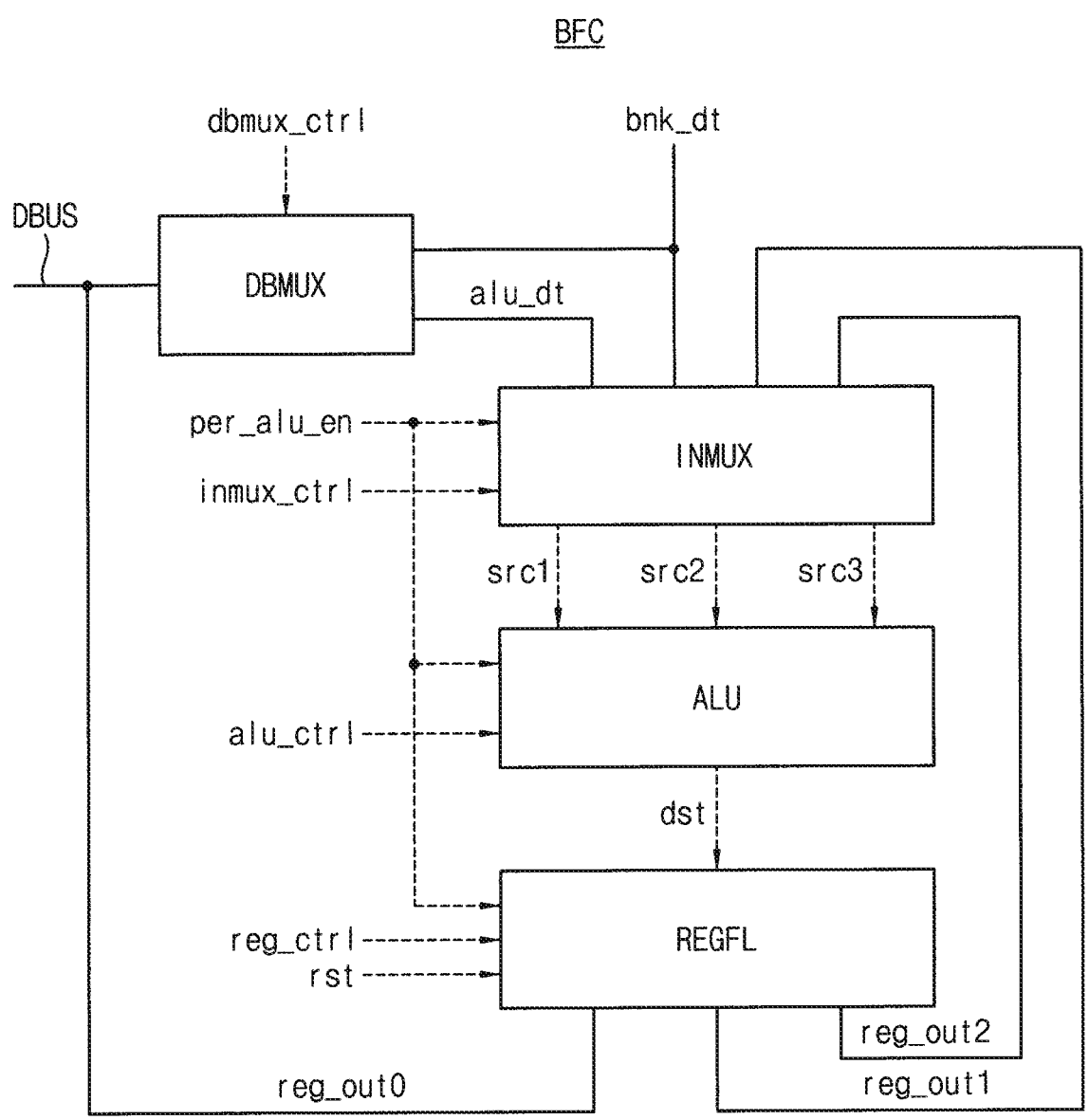
FIG. 10 is a block diagram illustrating an example embodiment of a bank FIM circuit included in the stacked memory device of FIG. 8.

FIG. 10 is a block diagram illustrating an example embodiment of a bank FIM circuit included in the stacked memory device of FIG. 8.

Referring to FIG. 10, a bank FIM circuit BFC corresponding to each memory bank may include an operation circuit ALU, a register file REGFL and a data path control circuit. The data path control circuit may include a data bus multiplexer DBMUX and an input multiplexer INMUX.

The operation circuit ALU may perform the data processing with respect to at least one of first source data src1, second source data src2 and/or third source data src3 to generate processing result data dst based on the operation circuit control signal alu_ctrl.

The register file REGFL may store the processing results data dst provided from the operation circuit ALU based on the register control signal reg_ctrl. In addition, the register file REGFL may output at least one of first register output data reg_out0, second register output data reg_out1 and third register output data reg_out2 based on the register control signal reg_ctrl. The register file REGFL may be initialized in response to the reset signal rst.

The data path control circuit including the data bus multiplexer DBMUX and the input multiplexer INMUX may control connections between an input of the operation circuit ALU, an output of the register file REGFL, a memory bank and the data bus DBUS to communicate with the buffer semiconductor die BSD.

The data bus multiplexer DBMUX may output the data on the data bus DBUS or the bank data bnk_dt from the memory bank, as operation data alu_dt, based on the data bus multiplexer control signal dbmux_ctrl. In addition, the data bus multiplexer DBMUX may, based on the data bus multiplexer control signal dbmux_ctrl output the data on the data bus DBUS as the bank data bnk_dt to be written in the memory bank, or output the bank data bnk_dt read from the memory bank to the data bus DBUS.

The input multiplexer INMUX may receive at least one of the operation data alu_dt, the bank data bnk_dt, the second register output data reg_out1 and the third register output data reg_out2 and provide at least one of the first source data src1, the second source data src2 and/or the third source data src3 to the operation circuit ALU based on the input multiplexer control signal inmux_ctrl.

A per operation circuit enable signal per_alu_en may be a signal that is independently provided to each bank FIM circuit BFC. The corresponding bank FIM circuit BFC may be enabled in response to the per operation circuit enable signal per_alu_en. In a multi-bank FIM mode, a plurality of per operation circuit enable signals per_alu_en [0:m] respectively provided to a plurality of bank FIM circuits BFC0~BFCm may be activated simultaneously or in a same clock cycle and the parallel data processing may be performed by the plurality of bank FIM circuits BFC0~BFCm. In a single-bank FIM mode, one of the plurality of per operation circuit enable signals per_alu_en [0:m] may be activated selectively and the data processing may be performed by the selected bank FIM circuit.

FIG. 11 is a diagram illustrating an example embodiment of FIM instructions stored in a stacked memory device according to example embodiments. The example embodiment of FIG. 11 corresponds to a sequential execution mode.

Referring to FIG. 11, an FIM instruction queue may include an instruction field INSTR, a destination field DST, first through third source fields SRC1, SRC2 and SRC3, and a mask field MASK. Also a read command RD and a write command WR transferred from the host device HOST to the stacked memory device MEM for each FIM instruction in the sequential execution mode, FIM operation descriptions, a read data path RDP and a write data path WDP within the memory semiconductor die are illustrated in FIG. 11.

In the sequential execution mode, depending on the read command RD or the write command WR, the instructions stored in the FIM instruction queue may be executed one by one, the bank data read from the memory bank may be transferred to the operation circuit in the bank FIM circuit, and/or the data from the register file may be stored in the memory bank.

In FIG. 11, REGx, REGy and REGz indicate addresses or data of registers included in the above-described register file REGFL, IOSA and WRDRV of FIG. 8 indicate the read data (or corresponding address) and the write data (or corresponding address) of the memory bank, DBUS indicates the data of the data bus or the device identifier of the data bus. With respect to the read data path RDP and the write data path WDP, DISABLE indicates that the corresponding data path is disabled, BANK indicates the corresponding memory bank, ALU indicates the operation circuit included in the corresponding bank FIM circuit, and DBUS indicates the data bus.

Identifiers of the FIM instructions may be stored in the instruction field INSTR, and information (e.g., device identifiers or addresses) on the corresponding data may be stored in the destination field DST and the first through third source fields SRC1, SRC2 and SRC3.

The MAC instruction indicates the FIM operation that multiplication and addition of the data corresponding to the addresses in the source fields SRC1, SRC2 and SRC3 are performed and the processing result data dst is stored in the address in the destination field DST. The MUL instruction indicates the FIM operation that multiplication of the data corresponding to the addresses in the source fields SRC1 and SRC2 is performed and the processing result data dst is stored in the address in the destination field DST. The ADD/SUB instruction indicates the FIM operation that addition/subtraction of the data corresponding to the addresses in the source fields SRC1 and SRC2 is performed and the processing result data dst is stored in the address in the destination field DST. The LOAD instruction indicates the FIM operation that the data corresponding to the address in the source field SRC1 is loaded to the address in the destination field DST. The STORE instruction indicates the FIM operation that the data corresponding to the address in the source field SRC1 is written to the address in the destination field DST. The MOV instruction indicates the FIM operation that the data corresponding to the address in the source field SRC1 is moved to the address in the destination field DST. The JUMP instruction indicates the FIM operation that a currently-executed program counter PCNT is set to JUMP TARGET among the plurality of FIM instructions stored in the FIM instruction queue.

The mask field MASK stores a mask value to selectively enable the plurality of bank FIM circuits. For example, when the mask value is "000000", the operation circuits ALU in the plurality bank FIM circuits may be enabled simultaneously and the data processing of the plurality of bank FIM circuits may be performed simultaneously (all alu operation), such as in a same clock cycle. In contrast, when the mask value is between "110000" through "111111", only one operation circuit of the one bank FIM circuit corresponding to the mask value may be enabled and the data processing of the one bank FIM circuit may be performed at each time (single alu operation). The above-described per operation circuit enable signals per_alu_en[0:m] may be generated based on the mask value.

FIG. 12 is a diagram illustrating FIM control signals of a stacked memory device according to example embodiments.

Referring to FIG. 12, the FIM controller may generate the FIM channel control signals SFC, the FIM instruction decoder may generate the internal instruction signal instr, and the operation (ALU) controller may generates the FIM die control signals SFD.

The FIM channel control signals SFC may include the multi-bank enable signal mb_en, the bank disable signal bnk_dis, the operation circuit enable signal alu_en, the reset signal rst, the queue input control signal in_ctrl and the queue output control signal out_ctrl. The FIM die control signals SFD may include the data bus disable signal dbus_dis, the bank read disable signal bnk_rd_dis, the bank write disable signal bnk_wr_dis, the data bus multiplexer control signal dbmux_ctrl, the per operation circuit enable signal per_alu_en, the input multiplexer control signal inmux_ctrl, the operation circuit control signal alu_ctrl and the register control signal reg_ctrl.

Referring back to FIGS. 8 through 10, when the multi bank enable signal mb_en is activated, the bank address bnk_addr may be neglected and all of the memory banks may be selected to perform the multi-bank operation. The operation controller 210 may perform the FIM operation with respect to all of the memory banks corresponding to each channel when the multi bank enable signal mb_en is activated. In contrast, when the multi bank enable signal mb_en is deactivated, the FIM operation may be performed with respect to one memory bank among the memory banks corresponding to each channel.

When the bank disable signal bnk_dis is activated, the bank controllers 430a~430h may be disabled and the internal command signal cmd may be neglected. The operation controller 210 may be enabled when the operation circuit enable signal alu_en is activated. When the reset signal rst is activated, the values stored in the FIM control register FCREG and the register file REGFL may be initialized and the FIM channel control circuit 110 in the FIM front-end circuit may convert the stacked memory device from the FIM mode of performing the FIM operation to the normal mode of performing the normal operation.

The FIM instruction queue may store the FIM instructions instr_in included in the data signal transferred from the host device based on the queue input control signal in_ctrl, and output the FIM instructions instr_out based on the queue output control signal out_ctrl. The FIM instruction decoder INSDEC may decode the FIM instructions instr_out from the FIM instruction queue FIMIQ to generate the internal instruction signal instr.

When the data bus disable signal dbus_dis is activated, the data bus controller 442 may electrically disconnect the data bus DBUS from the DQ. The read control signal rd_ctrl by the read command RD may be disabled when the bank read disable signal bnk_rd_dis is activated, and the write control signal wr_ctrl by the write command WR may be disabled when the bank write disable signal bnk_wr_dis is activated. The data on the data bus DBUS may transferred to the operation circuit ALU as the operation data alu_dt. The input multiplexer INMUX, the operation circuit ALU and the register file REGFL may be independently enabled with respect to the bank FIM circuits BFC0~BFC15 based on the respective per operation circuit enable signal per_alu_en[0:15]. The data transferred from the input multiplexer INMUX to the operation circuit ALU may be selected based on the input multiplexer control signal inmux_strl. The operation circuit ALU may perform data processing with respect to at least one of the first source data src1, the second source data src2 and/or the third source data src3 to generate the processing result data dst based on the operation circuit control signal alu_ctrl. The register file REGFL may, based on the register control signal reg_ctrl, store the processing result data dst provided from the operation circuit ALU.

The per operation circuit enable signals per_alu_en[0:15] illustrated in FIG. 12 indicate a case that the number of the memory banks corresponding to each channel is 16, and the number of the per operation circuit enable signals may be determined depending on the channel configuration.

Figure 13:
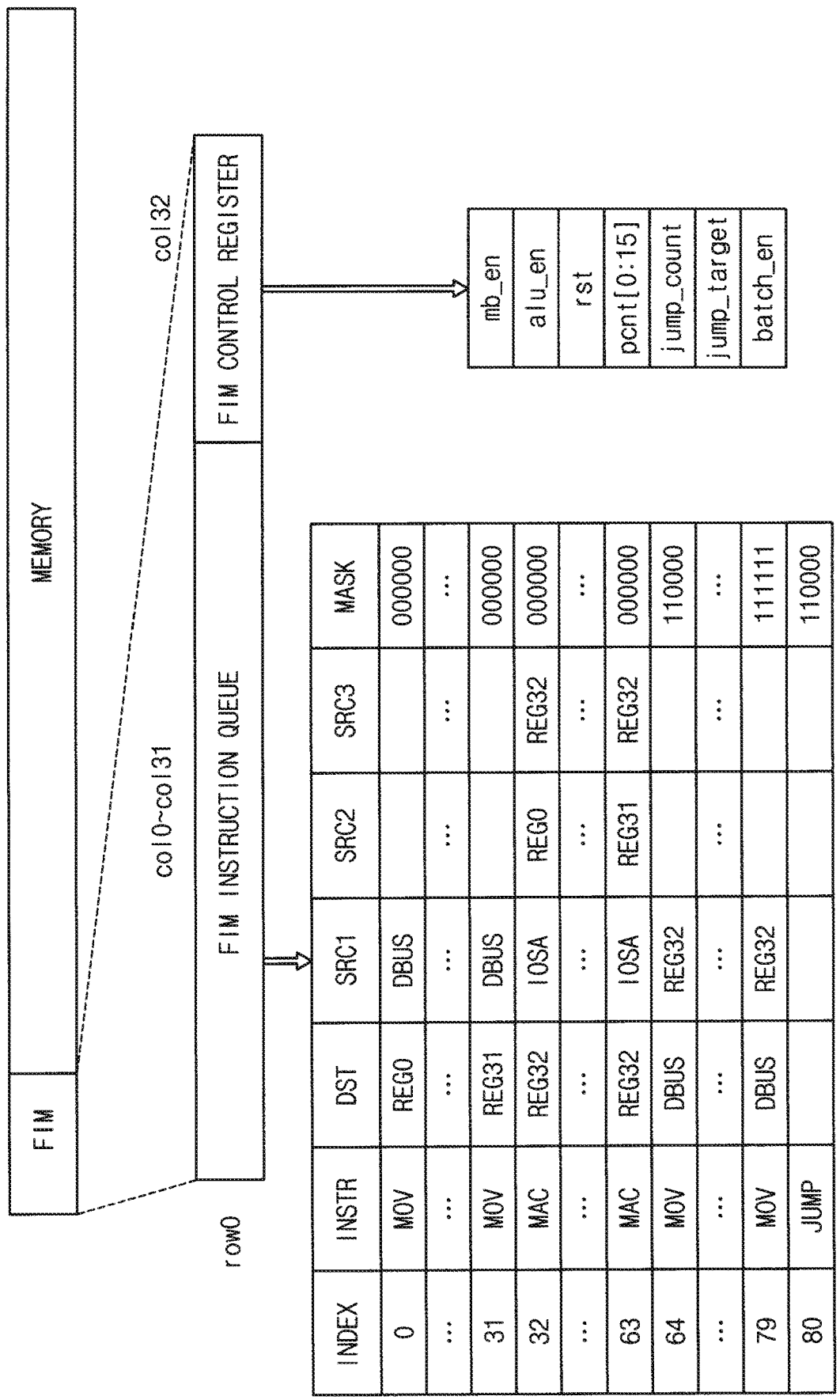
FIG. 13 is a diagram illustrating address mapping of a system including a stacked memory device according to example embodiments.
Figure 14:
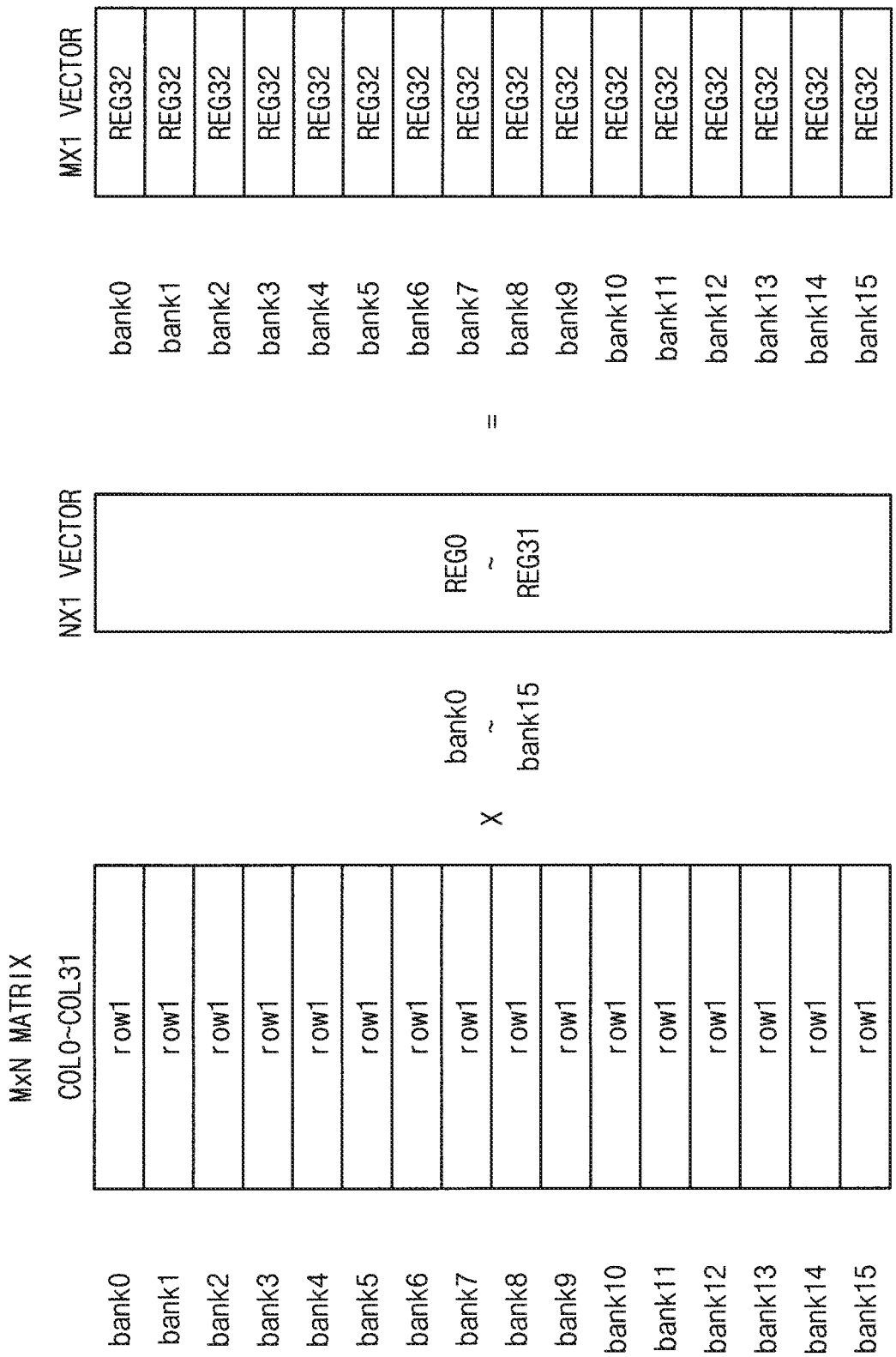
FIG. 14 is a diagram illustrating data processing performed by a stacked memory device according to example embodiments.

FIG. 13 is a diagram illustrating an example embodiment of address mapping of a system including a stacked memory device according to example embodiments, and FIG. 14 is a diagram illustrating an example data processing performed by a stacked memory device according to example embodiments.

Referring to FIG. 13, the host device may assign a portion of a system address space to set a FIM control address indicating the FIM instruction queue and the FIM control register. The host device may use the command of the normal operation and the FIM control address to control read and write operations of the FIM instructions and the configuration information.

For example, a specific row address row0 of all memory banks may be assigned to the FIM control address. The FIM control address row0 may indicate the FIM instruction queue and the FIM control register regardless of the bank address. The column addresses col0~col31 combined with the FIM control address row0 may indicate the storage positions in the FIM instruction queue and the column address col32 combined with the FIM control address row0 may indicate the FIM control register.

An example embodiment of the configuration information stored in the FIM control register is illustrated in the right-bottom portion of FIG. 13. The configuration information stored in the FIM control register may include information on a multi-bank enable signal mb_en, an operation circuit enable signal alu_en, a reset signal rst, a program counter pcnt[0:15], a jump count jump_count, a jump target jump_target and a batch_enable signal batch_en.

When the multi-bank enable signal mb_en is activated, all of the memory banks may be activated or precharged simultaneously or in a same clock cycle by the active command ACT or the precharge command PRE. When the operation circuit enable signal alu_en is activated, the operation controller ALUCON may be enabled to perform the FIM operation. When the reset signal rst is activated, the values stored in the FIM control register FCREG and the register file REGFL may be initialized. The program counter pcnt[0:15] may be managed per memory bank to indicate an index INDEX of the FIM instruction queue to be executed currently. The jump count jump_count may indicate the number of executing the JUMP instruction, and the jump target jump_target may indicate a value of changing the program counter pcnt[0:15]. The activation of the batch_enable signal batch_en may indicate the batch execution mode and the deactivation of the batch_enable signal batch_en may indicate the sequential execution mode.

An example embodiment of a FIM instruction sequence stored in the FIM instruction queue is illustrated in the left-bottom portion of FIG. 13. The FIM instruction sequence is substantially the same as described with reference to FIG. 11, and the repeated descriptions are omitted.

The FIM instruction sequence in FIG. 13 corresponds to a matrix-vector multiplication as illustrated in FIG. 14.

The data on the data bus DBUS may be the register files REGFL of all of bank FIM circuits by the MOV instructions of the indices 0~31. Each register file REGFL may include a plurality of data registers REG0~REG32, the data on the data bus DBUS may be stored sequentially in the data registers REG0~REG31 by the MOV instructions of the indices 0~31. The processing result data of the multiplication and the addition may be sequentially accumulated in the data register REG32 by the MAC instruction of indices 32~63.

In this way, as illustrated in FIG. 14, the final processing result data of the multiplication and the addition with respect to the M×N matrix comprised of the data in one row row1 of the plurality of memory banks bank0~bank15 and N×1 vector comprised of the data in the data registers REG0~REG31 corresponding to the plurality of memory banks bank0~bank15 may be stored in the data register REG32 as the M×1 vector. As described above, the FIM operation may be performed with respect to all of the memory banks corresponding each channel when the mask value is "000000".

After that, the data accumulated in the data register REG32 corresponding to the plurality of memory banks bank0~bank15 may be read out sequentially to the data bus DBUS by the MOV instructions of indices 64~80. As described above, the FIM operation may be performed with respect to one memory bank among the memory banks corresponding to each channel when the mask value is between "110000" through "111111".

FIG. 15A through 15G are diagrams illustrating data paths of a FIM operation in a stacked memory device according to example embodiments.

Data paths corresponding to various FIM instructions are illustrated in FIGS. 15A through 15G. The FIM instructions and the control signals in FIGS. 15A through 15G are the same as described above, and the descriptions of the FIM instructions and the control signals are omitted. CSL indicates a column selection signal that may be generated based on the column address col_addr by the column decoders 470a~470h and applied to the bank cell arrays 480a~480h in FIG. 8.

Figure 15A:
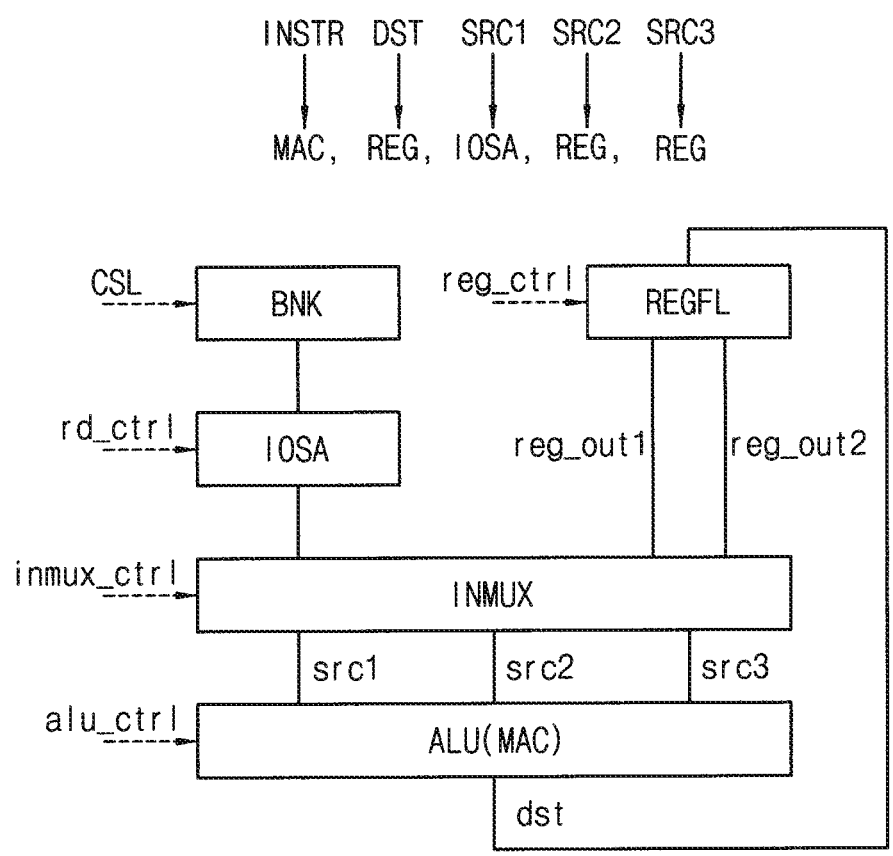
FIG. 15A through 15G are diagrams illustrating data paths of a FIM operation in a stacked memory device according to example embodiments.

Referring to FIG. 15A, the data read out from memory bank BNK may be output to the input-output sense amplifier IOSA and the bank data may be provide as the first source data src1 to the operation circuit ALU through the input multiplexer INMUX. The second register output data reg_out1 and the third register output data reg_out2 from the register file REGFL may be provided as the second source data src2 and the third source data src3 to the operation circuit ALU through the input multiplexer INMUX. The operation circuit ALU may perform the MAC operation based on the first through third source data src1~src3 to generate the processing result data dst, and the processing result data dst may be stored in the register file REGFL.

Figure 15B:
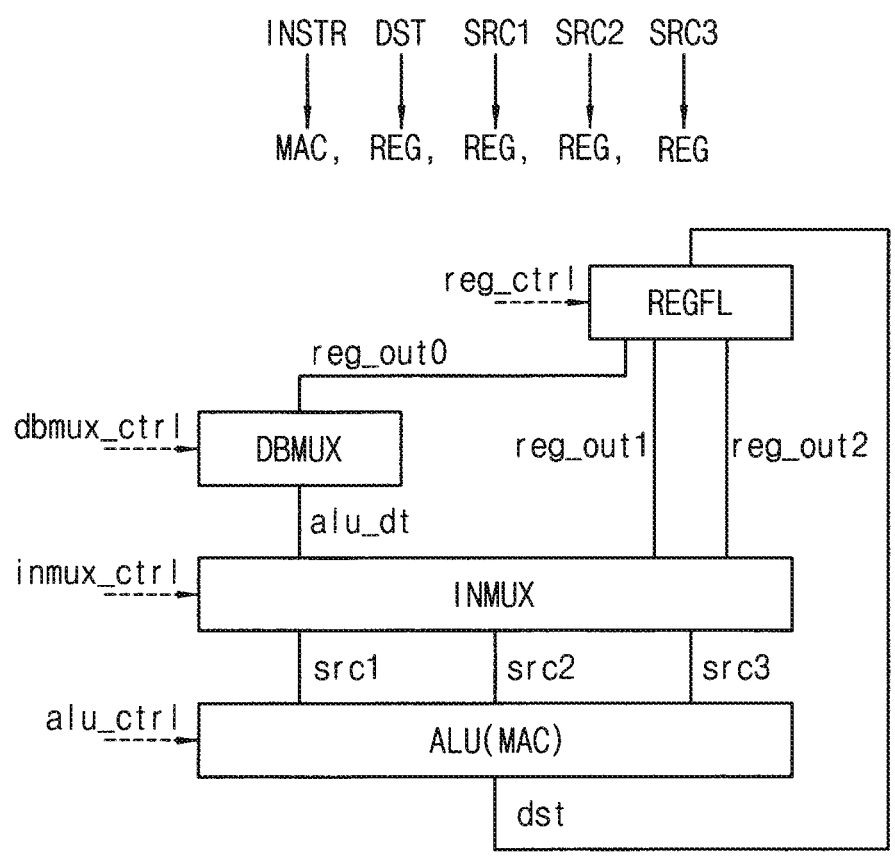

Referring to FIG. 15B, the first register output data reg_out0 from the register file REGFL may be provided as the operation data alu_dt to the input multiplexer INMUX through the data bus multiplexer DBMUX, and the operation data alu_dt may be provided as the first source data src1 to the operation circuit ALU through the input multiplexer INMUX. The second register output data reg_out1 and the third register output data reg_out2 from the register file REGFL may be provided as the second source data src2 and the third source data src3 to the operation circuit ALU through the input multiplexer INMUX. The operation circuit ALU may perform the MAC operation based on the first through third source data src1~src3 to generate the processing result data dst, and the processing result data dst may be stored in the register file REGFL.

Figure 15C:
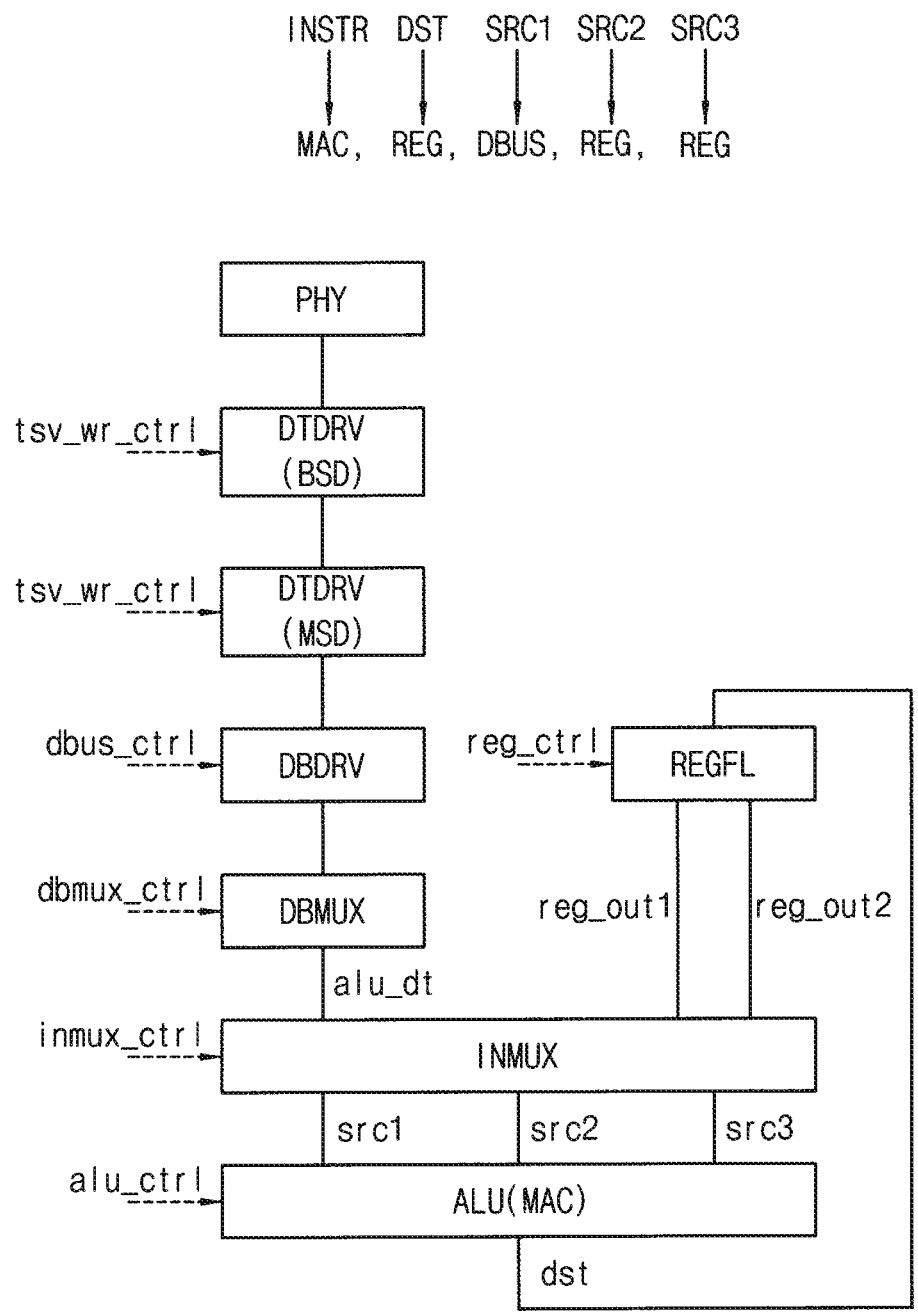

Referring to FIG. 15C, the data transferred from the host device may be provided as the operation data alu_dt to the input multiplexer INMUX through the physical layer PHY the DQ TSV driver DTDRV in the buffer semiconductor die BSD, the DQ TSV driver DTDRV in the memory semiconductor die MSD, the data bus driver DBDRV and the data bus multiplexer DBMUX, and the operation data alu_dt may be provided as the first source data src1 to the operation circuit ALU through the input multiplexer INMUX. The second register output data reg_out1 and the third register output data reg_out2 from the register file REGFL may be provided as the second source data src2 and the third source data src3 to the operation circuit ALU through the input multiplexer INMUX. The operation circuit ALU may perform the MAC operation based on the first through third source data src1~src3 to generate the processing result data dst, and the processing result data dst, may be stored in the register file REGFL.

Figure 15D:
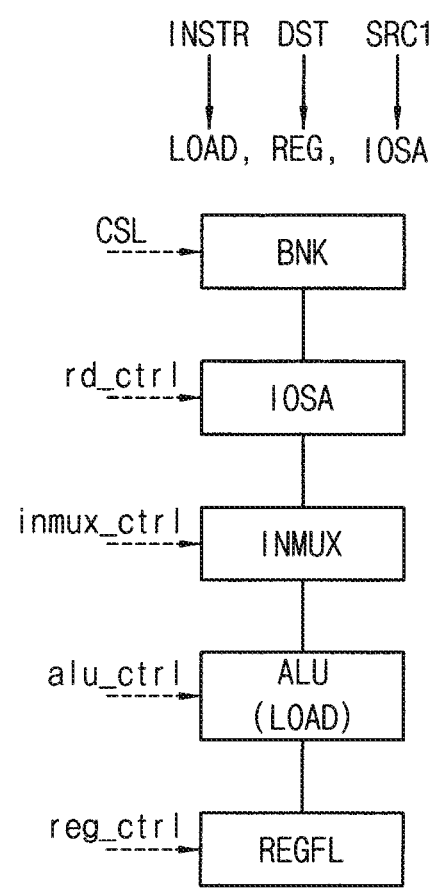

Referring to FIG. 15D, the LOAD instruction may be performed such that the data read from the memory bank BNK may be loaded to the operation circuit ALU through the input-output sense amplifier IOSA and the input multiplexer INMUX, and the loaded data may be finally stored in the register file REGFL.

Figure 15E:
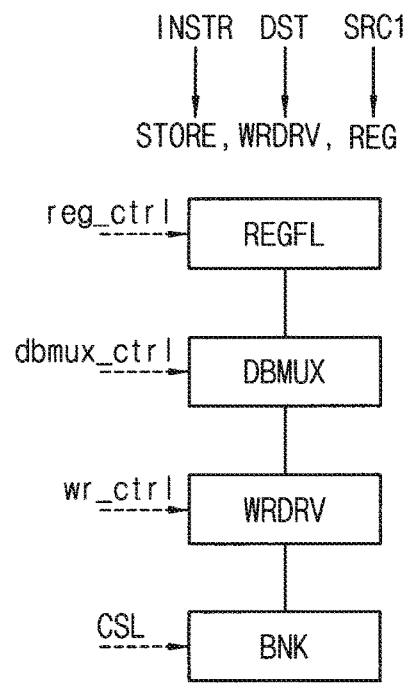

Referring to FIG. 15E, the STORE instruction may be performed such that the data output from the register file REGFL may be written to the memory bank BNK through the data bus multiplexer DBMUX and the write driver WRDRV.

Figure 15F:
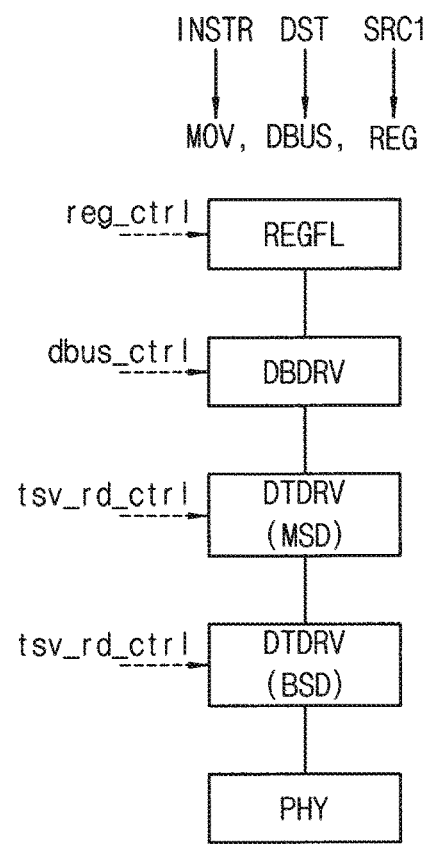

Referring to FIG. 15F, the MOV instruction may be performed such that the data output from the register file REGFL may be transferred to the host device through the data bus driver DBDRV, the DQ TSV driver DTDRV in the memory semiconductor die MSD, the DQ TSV driver DTDRV in the buffer semiconductor die BSD and the physical layer PHY.

Figure 15G:
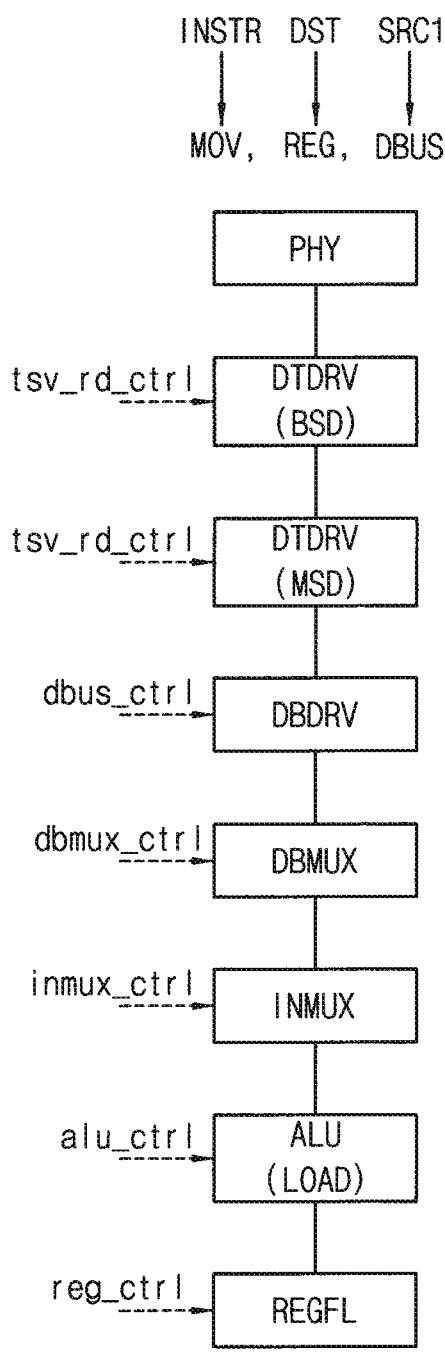

Referring to FIG. 15G, the MOV instruction may be performed such that the data transferred from the host device may be loaded to the operation circuit ALU through the physical layer PHY, the DQ TSV driver DTDRV in the buffer semiconductor die BSD, the DQ TSV driver DTDRV in the memory semiconductor die MSD, the data bus driver DBDRV, the data bus multiplexer DBMUX and the input multiplexer INMUX, and the loaded data may be finally stored in the register file REGFL.

FIGS. 16A through 18B are diagrams illustrating example operations of a stacked memory device according to example embodiments.

Figure 16B:
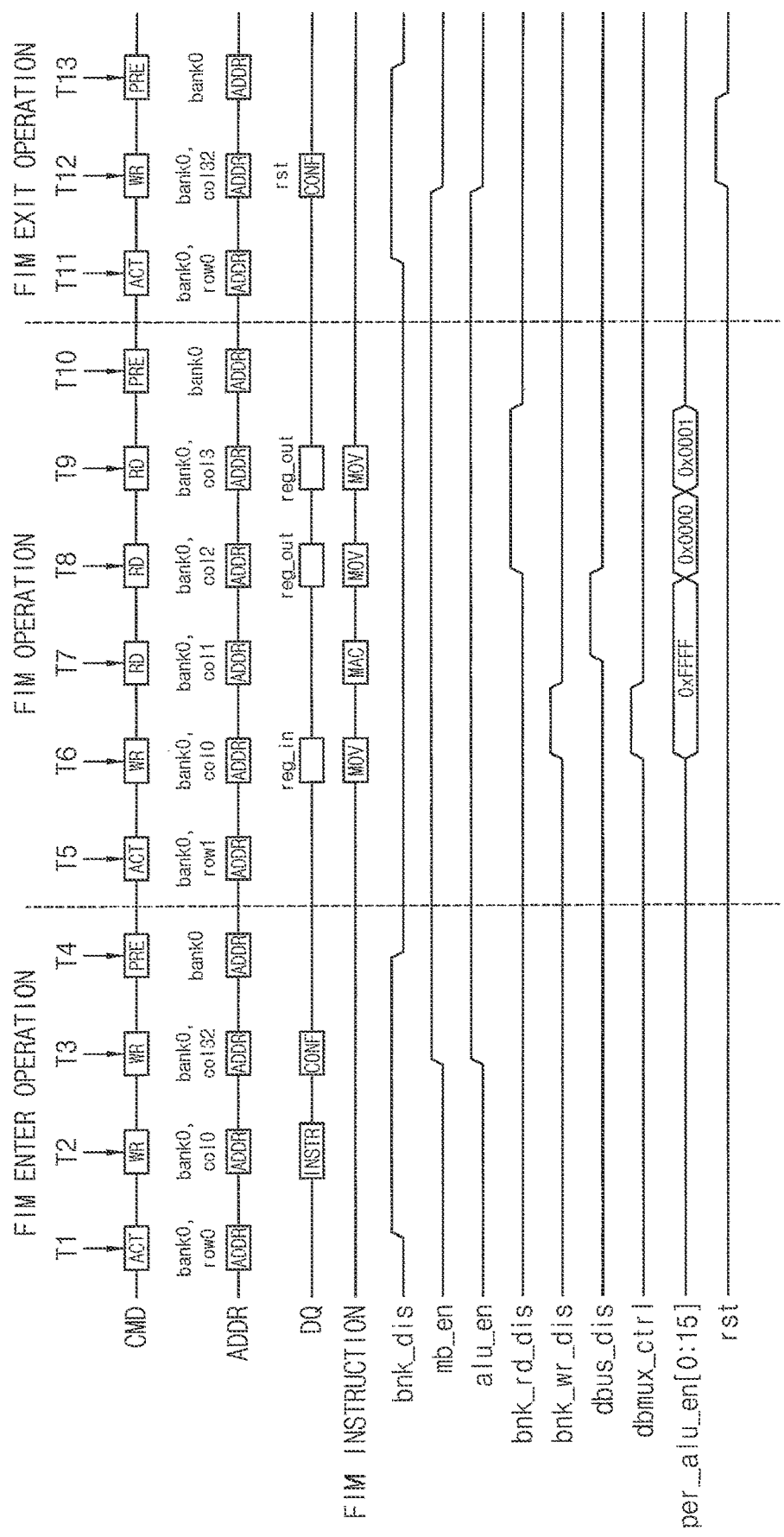

FIG. 16A illustrates an example FIM instruction sequence that sequentially includes MOV, MAC, MOV and MOV instructions stored in the FIM instruction queue of indices 0~3. FIG. 16B is a timing diagram illustrating an operation of a stacked memory device performing the FIM instruction sequence of FIG. 16A.

Referring to FIG. 16A, the MOV instruction of index 0 indicates a FIM operation that the same data transferred from the host device are stored in the register files of all memory banks corresponding to each channel. The MAC instruction of index 1 indicates a FIM operation that the operation circuits corresponding to the plurality of memory banks perform the MAC operation simultaneously or in a same clock cycle based on the read data from the plurality of memory banks and the data stored in the register files corresponding to the plurality of memory banks. The MOV instruction of index 2 indicates the FIM operation that the data of the register file corresponding to the mask value of "110000" are output to the data bus DBUS, and the MOV instruction of index 3 indicates the FIM operation that the data of the register file corresponding to the mask value of "110001" are output to the data bus DBUS. As such, the FIM operation with respect to the plurality of memory banks may be limited depending on the mask value even in the multi-bank mode.

Referring to FIG. 16B, based on the command signal CMD and the address signal ADDR transferred from the host device, the stacked memory device may perform a FIM enter operation at time points T1~T4 to convert the operation mode from the normal mode to perform the normal operation of the stacked memory device to the FIM mode to perform the FIM operation and perform a FIM exit operation at time points T11~T13 to convert the operation mode from the FIM mode to the normal mode. Even though the command signal CMD and the address signal ADDR are distinct from each other in FIG. 16B, the command and the address may be provided from the host device through the command-address signal in which the command and the address are merged as described above with reference to FIGS. 7A and 7B.

The stacked memory device may operate in the multi-bank FIM mode and in the sequential execution mode at time points T5~T10. The stacked memory device may perform the parallel data processing with respect to a plurality of memory banks in the multi-bank FIM mode. In addition, the stacked memory device may execute one FIM instruction among the plurality of FIM instructions stored in the FIM front-end circuit based on the command-address signal such that the one FIM instruction corresponds to one command and one address included in the command-address signal.

Referring to FIGS. 8, 9, 10, 16A and 16B, at time point T1, the FIM channel control circuit 110 may activate the bank disable signal bnk_dis based on the active command ACT, the bank address bank0 and the row address row0. While the bank disable signal bnk_dis is activated, the row decoder circuit 460 may neglect the received commands. The row address row0 may correspond to the FIM control address as described with reference to FIG. 13.

At time point T2, based on the write command WR, the bank address bank0 and the column address col0, the FIM channel control circuit 110 may receive and store the plurality of FIM instructions INSTR through the data signal DQ transferred from the host device. The column address col0 corresponds to the address of the FIM instruction queue FIMIQ.

At time point T3, based on the write command WR, the bank address bank0 and the column address col32, the FIM channel control circuit 110 may receive and store the configuration information CONF through the data signal DQ transferred from the host device. The column address col32 corresponds to the address of the FIM control register FCREG. The FIM channel control circuit 110 may activate the multi-bank enable signal mb_en and the operation circuit enable signal alu_en based on the stored configuration information CONF.

At time point T4, based on the precharge command PRE and the bank address bank0, the ELM channel control circuit 110 may deactivate the bank disable signal bnk_dis and the bank control circuit 430 may perform the precharge operation with respect to all memory banks corresponding to each channel.

The FIM operation may be performed after the FIM enter operation at time points T1~T4 is completed.

At time point T5, based on the active command ACT, the bank address bank0, the row address row1 and the activated multi-bank enable signal mb_en, the bank control circuit 430 may activate the word line corresponding to the row address row1 with respect to all memory banks.

At time point T6, based on the write command WR, the bank address bank0 and the column address col0, the MOV instruction stored in the FIM instruction queue FIMIQ of index 0 may be performed. The column address col0 corresponds to the index 0 of the FIM instruction queue FIMIQ. Here, the operation controller 210 may activate the bank write disable signal bnk_wr_dis to prevent data from being written to the memory banks, and activate the data bus multiplexer control signal dbmux_ctrl to electrically connect the data bus DBUS and the input multiplexer INMUX. All of the per operation circuit enable signals per_alu_en[0:15] may be activated (OxFFFF) according to the mask value of "000000". Accordingly, the register input data reg_in through the data signal DQ transferred from the host device may be stored in the data register REG0 of the register files REGFL corresponding to all memory banks.

At time point T7, based on the read command RD, the bank address bank0 and the column address col1, the MAC instruction stored in the FIM instruction queue FIMIQ of index 1 may be performed. The column address col1 corresponds to the index 1 of the FIM instruction queue FIMIQ. Here, the operation controller 210 may activate the data bus disable signal dbus_dis such that the data read from the memory banks may be prevented from being output to the data bus DBUS. AU of the per operation circuit enable signals per_alu_en[0:15] may be activated (OxFFFF) according to the mask value of "000000". Accordingly, the operation circuit ALU corresponding to all memory banks may perform the MAC operation based on the data read from the row address row1 of the memory banks and the data stored in the registers REG0 and REG32 and the processing result data may be stored in the register REG32.

At time point T8, based on the read command RD, the bank address bank0 and the column address col2, the MOV instruction stored in the FIM instruction queue FIMIQ of index 2 may be performed. The column address col2 corresponds to the index 2 of the FIM instruction queue FIMIQ. Here, the operation controller 210 may activate the bank read disable signal bnk_rd_dis to prevent the data from being read out from the memory banks. Even though the multi-bank enable signal mb_en is still activated, only the one per operation circuit enable signal may be activated (Ox0000) according to the mask value of "110000". Accordingly, only the one bank FIM circuit corresponding to the activated per operation circuit enable signal among the bank FIM circuits 212a~212h may be activated, and the register output data reg_out may be output from the data register REG32 of the register file REGFL of the activated bank FIM circuit to the data bus DBUS.

At time point T9, based on the read command RD, the bank address bank0 and the column address col3, the MOV instruction stored in the FIM instruction queue FIMIQ of index 3 may be performed. The column address col3 corresponds to the index 3 of the FIM instruction queue FIMIQ. Here, the operation controller 210 may activate the bank read disable signal bnk_rd_dis to prevent the data from being read out from the memory banks. Even though the multi-bank enable signal mb_en is still activated, only the another per operation circuit enable signal may be activated (Ox0001) according to the mask value of "110001". Accordingly, only the another bank FIM circuit corresponding to the activated per operation circuit enable signal among the bank FIM circuits 212a~212h may be activated, and the register output data reg_out may be output from the data register REG32 of the register file REGFL of the activated bank FIM circuit to the data bus DBUS.

At time point T10, based on the precharge command PRE and the bank address bank0, the bank control circuit 430 may perform the precharge operation with respect to all memory banks corresponding to each channel.

The FIM exit operation may be performed after all of the FIM instructions stored in the FIM instruction queue FIMIQ are executed at time points T5~T10.

At time point T11, the FIM channel control circuit 110 may activate the bank disable signal bnk_dis based on the active command ACT, the bank address bank0 and the row address row0. As described above, while the bank disable signal bnk_dis is activated, the row decoder circuit 460 may neglect the received commands.

At time point T12, based on the write command WR, the bank address bank0 and the column address col32, the FIM channel control circuit 110 may receive and store the configuration information CONF transferred from the host device. Here, the configuration information CONF may include information to activate the reset signal rst. The FIM channel control circuit 110 may activate the reset signal rst, and initialize the values stored in the FIM control register FCREG and the register file REGFL in response to the activated reset signal rst.

At time point T13, based on the precharge command PRE and the bank address bank0, the FIM channel control circuit 110 may deactivate the bank disable signal bnk_dis and the bank control circuit 430 may perform the precharge operation with respect to all memory banks corresponding to each channel.

The stacked memory device may perform the normal operation after the FIM exit operation is completed at time points T11~T13.

Figure 17B:
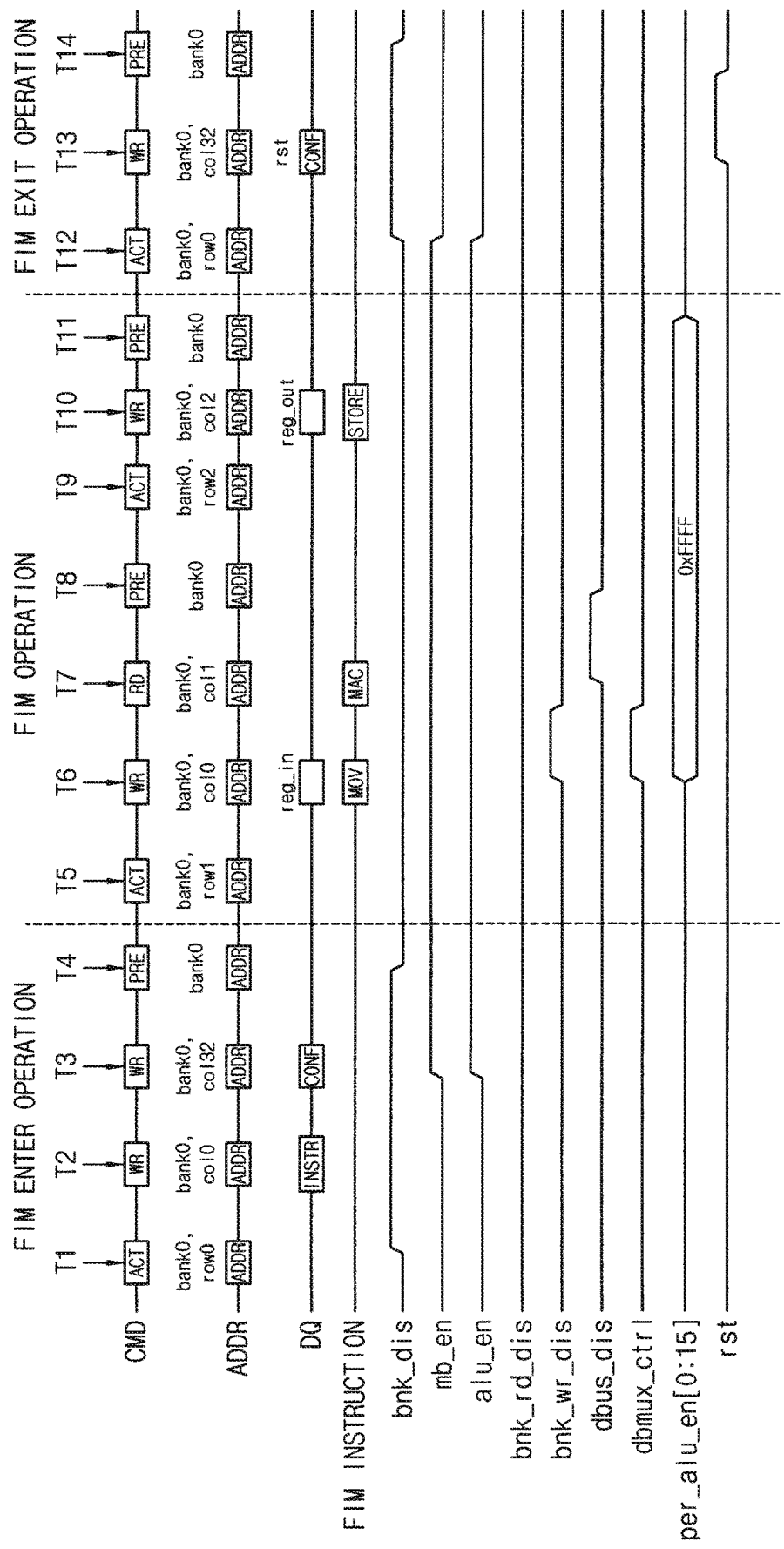

FIG. 17A illustrates an example FIM instruction sequence that sequentially includes MOV, MAC and STORE instructions stored in the FIM instruction queue of indices 0~2, and FIG. 17B is a timing diagram illustrating an operation of a stacked memory device performing the FIM instruction sequence of FIG. 17A.

Referring to FIGS. 17A and 17B, the stacked memory device may perform the FIM enter operation at time points T1~T4, and the FIM exit operation at time points T12~T14. The stacked memory device may perform the FIM operation at time points T5~T11 in the multi-bank FIM mode and in the sequential execution mode.

Referring to FIG. 17A, the MOV instruction of index 0 indicates a FIM operation that the same data transferred from the host device are stored in the register files of all memory banks corresponding to each channel. The MAC instruction of index 1 indicates a FIM operation that the operation circuits corresponding to the plurality of memory banks perform the MAC operation simultaneously or in a same clock cycle based on the read data from the plurality of memory banks and the data stored in the register files corresponding to the plurality of memory banks. The STORE instruction of index 2 indicates the FIM operation that the data of the register files corresponding to all memory banks are stored to all memory banks.

The operations at time points T1~T7 and T11-T14 in FIG. 17B are substantially the same as the operations at time points T1~T7 and T10~T13 in FIG. 16B, and the repeated descriptions are omitted.

Referring to FIGS. 8, 9, 10, 17A and 17B, at time point T8, the bank control circuit 430 may perform the precharge operation based on the precharge command PRE and the bank address bank0.

At time point T9, based on the active command ACT, the bank address bank0, the row address row2 and the activated multi-bank enable signal mb_en, the bank control circuit 430 may activate the word line corresponding to the row address row2 with respect to all memory banks. The row address row2 at time point T9 may be different from the row address row1 at time point T5. In other words, the row address row1 of the source data for the MAC operation may be different from the row address row2 of the processing result data to be stored.

At time point T10, based on the write command, the bank address bank0 and the column address col2, the STORE instruction stored in the FIM instruction queue FIMIQ of index 2 may be performed. The column address col2 corresponds to the index 2 of the FIM instruction queue FIMIQ. The register output data reg_out corresponding to the processing result data may be provided to all of the write drivers 492a~492h to be written in the column address col2 of all memory banks.

Figure 18B:
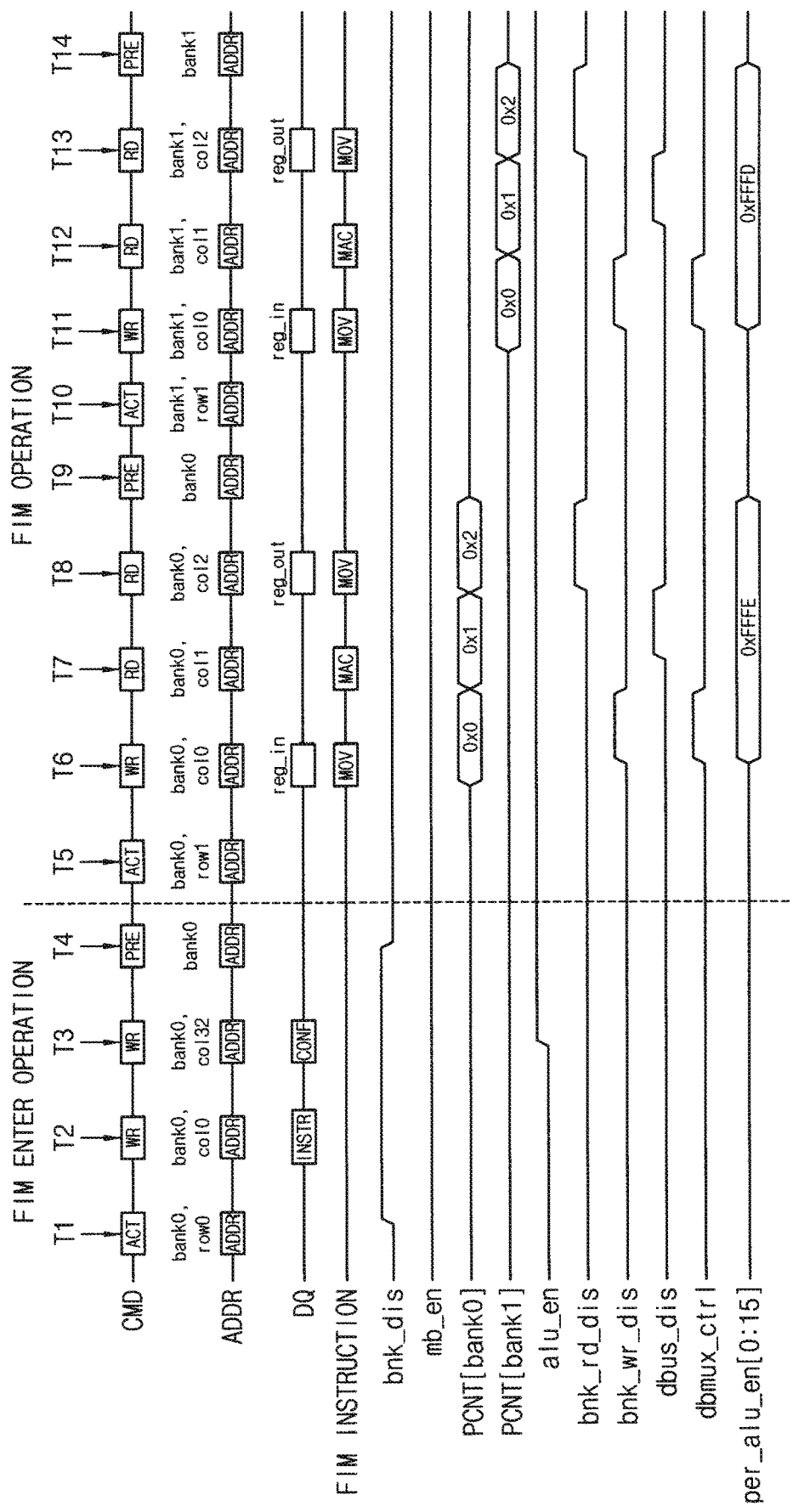

FIG. 18A illustrates an example FIM instruction sequence that sequentially includes MOV, MAC and MOV instructions stored in the FIM instruction queue of indices 0~2. FIG. 18B is a timing diagram illustrating an operation of a stacked memory device performing the FIM instruction sequence of FIG. 18A.

Referring to FIGS. 18A and 18B, the stacked memory device may perform the FIM enter operation at time points T1~T4, and the FIM operation at time points T5~T14 in the single-bank FIM mode and in the sequential execution mode. The FIM exit operation is the same as described with reference to FIG. 16B and omitted in FIG. 18B.

Referring to FIG. 18A, the MOV instruction of index 0 indicates a FIM operation that the data transferred from the host device are stored in the register file of one memory bank. The MAC instruction of index 1 indicates a FIM operation that the operation circuit corresponding to the one memory bank performs the MAC operation based on the read data from the one memory bank and the data stored in the register file corresponding to the one memory bank. The MOV instruction of index 2 indicates the FIM operation that the data of the register file corresponding to the one memory bank are output to the data bus DBUS. In such single-bank FIM mode, the mask values may be neglected.

Referring to FIGS. 8, 9, 10, 18A and 18B, at time point T1, the FIM channel control circuit 110 may activate the bank disable signal bnk_dis based on the active command ACT, the bank address bank0 and the row address row0. While the bank disable signal bnk_dis is activated, the row decoder circuit 460 may neglect the received commands. The row address row0 may correspond to the FIM control address as described with reference to FIG. 13.

At time point T2, based on the write command WR, the bank address bank0 and the column address col0, the FIM channel control circuit 110 may receive and store the plurality of FIM instructions INSTR through the data signal DQ transferred from the host device. The column address col0 corresponds to the address of the FIM instruction queue FIMIQ.

At time point T3, based on the write command WR, the bank address bank0 and the column address col32, the FIM channel control circuit 110 may receive and store the configuration information CONF through the data signal DQ transferred from the host device. The column address col32 corresponds to the address of the FIM control register FCREG. The FIM channel control circuit 110 may activate the operation circuit enable signal alu_en based on the stored configuration information CONF. Here, the configuration information CONF indicates the single-bank FIM mode and the FIM channel control circuit 110 may maintain the multi-bank enable signal mb_en in the deactivated state.

At time point T4, based on the precharge command PRE and the bank address bank0, the FIM channel control circuit 110 may deactivate the bank disable signal bnk_dis and the bank control circuit 430 may perform the precharge operation with respect to all memory banks corresponding to each channel.

The FIM operation may be performed after the FIM enter operation at time points T1~T4 is completed.

At time point T5, based on the active command ACT, the bank address bank0 and the row address row1, the bank control circuit 430 may activate the word line corresponding to the row address row1 with respect to the memory bank corresponding to the bank address bank0.

At time point T6, based on the write command WR, the bank address bank0 and the column address col0, the MOV instruction stored in the FIM instruction queue FIMIQ of index 0 may be performed. The column address col0 corresponds to the index 0 of the FIM instruction queue FIMIQ. Here, the operation controller 210 may activate the bank write disable signal bnk_wr_dis to prevent data from being written to the memory banks, and activate the data bus multiplexer control signal dbmux_ctrl to electrically connect the data bus DBUS and the input multiplexer INMUX. Accordingly, the register input data reg_in through the data signal DQ transferred from the host device may be stored in the data register REG0 of the register file REGFL corresponding to the bank address bank0.

At time point T7, based on the read command RD, the bank address bank0 and the column address col1, the MAC instruction stored in the FIM instruction queue FIMIQ of index 1 may be performed. The column address col1 corresponds to the index 1 of the FIM instruction queue FIMIQ. Here, the operation controller 210 may activate the data bus disable signal dbus_dis such that the data read from the memory banks may be prevented from being output to the data bus DBUS. Accordingly, the operation circuit ALU corresponding to the bank address bank0 may perform the MAC operation based on the data read from the row address row1 of the memory bank and the data stored in the registers REG0 and REG32 and the processing result data may be stored in the register REG32.

At time point T8, based on the read command RD, the bank address bank0 and the column address col2, the MOV instruction stored in the FIM instruction queue FIMIQ of index 2 may be performed. The column address col2 corresponds to the index 2 of the FIM instruction queue FIMIQ. Here, the operation controller 210 may activate the bank read disable signal bnk_rd_dis to prevent the data from being read out from the memory banks. Only one per operation circuit enable signal corresponding to the bank address bank0 may be activated. Accordingly, only one bank FIM circuit corresponding to the bank address bank0 may be activated among the plurality of bank FIM circuits 212a~212h, and the register output data reg_out may be output from the data register REG32 of the activated bank FIM circuit to the data bus DBUS.

At time point T9, based on the precharge command PRE and the bank address bank0, the bank control circuit 430 may perform the precharge operation with respect to the memory bank corresponding to bank address bank0.

As such, all of the FIM instructions stored in the FIM instruction queue FIMIQ may be performed at time points T5~T9. The value of the program counter PCNT[bank0] corresponding to the bank address bank0 may be increased sequentially by 1 such as 0x0, 0x1 and 0x2.

At time points T10~T14, substantially the same operations as the time points T5~T9 may be performed with respect to the bank address bank1. Here, only the one per operation circuit enable signal corresponding to the bank address bank1 is activated, and the value of the program counter PCNT[bank0] corresponding to the bank address bank1 may be increased sequentially by 1 such as 0x0, 0x1 and 0x2.

Figure 19:
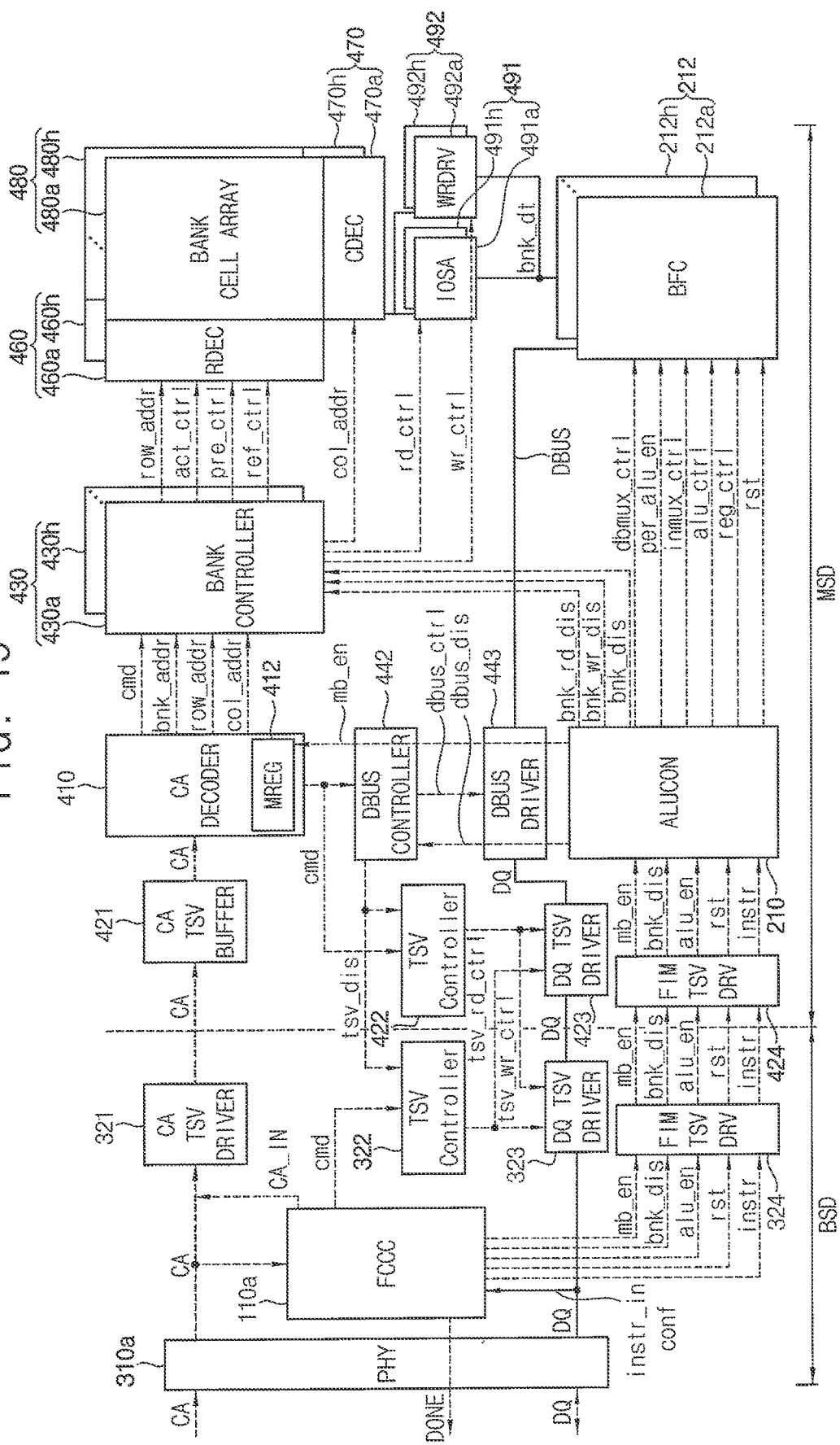
FIG. 19 is a diagram illustrating a stacked memory device according to example embodiments.

FIG. 19 is a diagram illustrating a stacked memory device according to example embodiments. A configuration illustrated in FIG. 19 is substantially the same as the configuration illustrated in FIG. 8, and the repeated descriptions are omitted and only the difference is described.

FIG. 19 illustrates a configuration of a stacked memory device that selectively perform the sequential execution mode or the batch execution mode. The sequential execution mode is the same as described with reference to FIGS. 8 through 18B, and the batch execution mode will be described with reference to FIGS. 19 through 24B.

The FIM channel control circuit (FCCC) 110a in FIG. 19 may receive the configuration information indicating the sequential execution mode or the batch execution mode. When the configuration information indicate the sequential execution mode, the FIM channel control circuit (FCCC) 110a included in the FIM front-end circuit may execute one FIM instruction among the plurality of FIM instructions stored in the FIM channel control circuit (FCCC) 110a based on the command-address signal, such that the one FIM instruction corresponds to one command and one address included in the command-address signal. In contrast, when the configuration information indicate the batch execution mode, the FIM channel control circuit (FCCC) 110a may sequentially execute the plurality of FIM instructions stored in the FIM channel control circuit (FCCC) 110a, regardless of the command-address signal.

When execution of the plurality of FIM instructions stored in the FIM front-end circuit is completed in the batch execution mode, the FIM channel control circuit (FCCC) 110a may generates a FIM end signal DONE and transfer the FIM end signal DONE to the host device through the physical layer 310a.

In addition, the FIM channel control circuit (FCCC) 110a may generate an internal command-address signal CA_IN to control the plurality of memory banks based on the plurality of FIM instructions stored in the FIM channel control circuit (FCCC) 110a.

Figure 20:
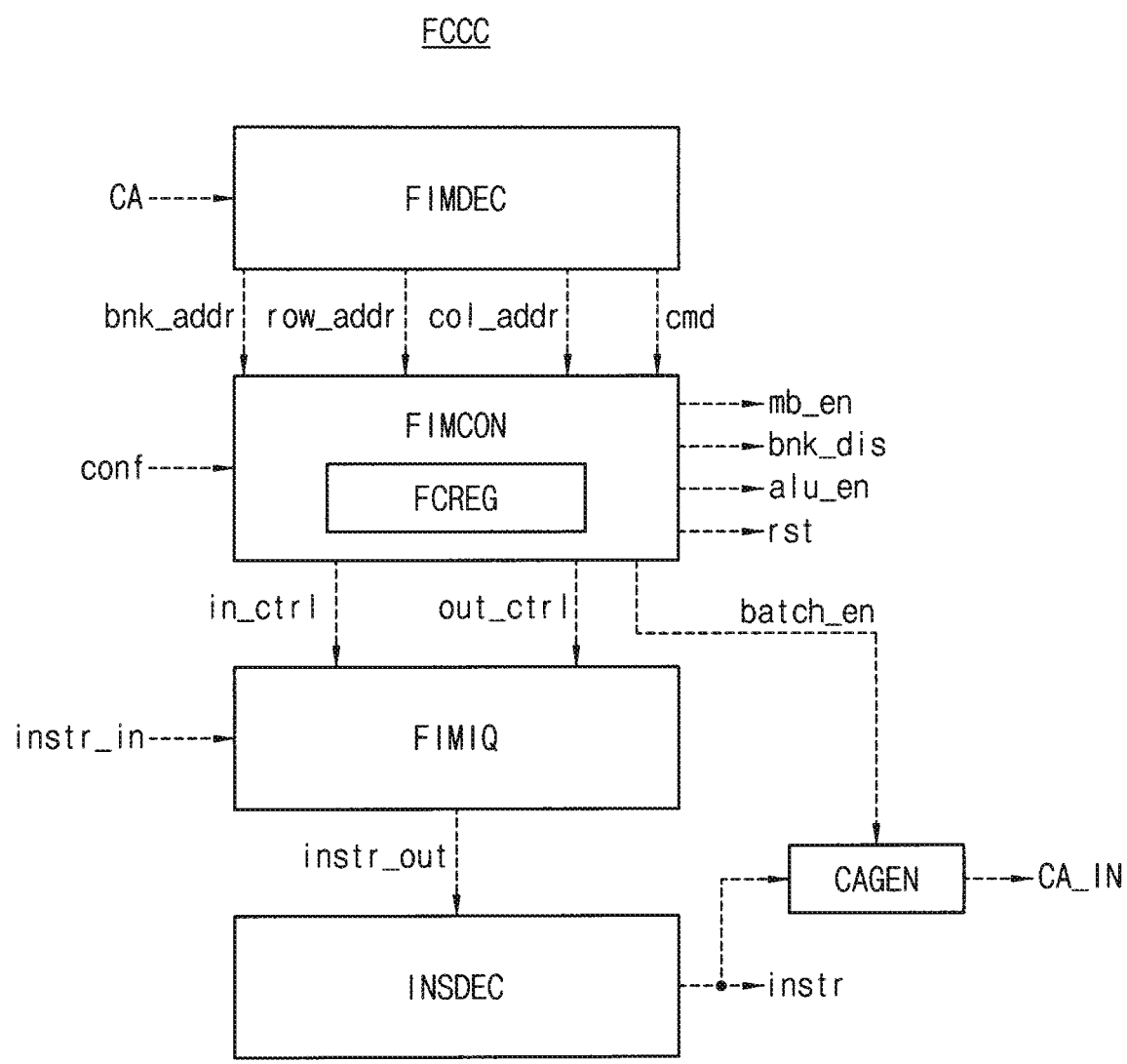
FIG. 20 is a block diagram illustrating a FIM channel control circuit included in the stacked memory device of FIG. 19.

FIG. 20 is a block diagram illustrating an example embodiment of a FIM channel control circuit included in the stacked memory device of FIG. 19.

Referring to FIG. 20, a FIM channel control circuit FCCC corresponding to each channel may include a FIM decoder FIMDEC, a FIM controller FIMCON, a FIM instruction queue FIMIQ, a FIM instruction decoder INSDEC and a command-address generator CAGEN. The components except the command-address generator CAGEN in FIG. 20 are the same as or similar to those in FIG. 9, and the repeated descriptions are omitted.

The FIM controller FIMCON may generate the batch_enable signal batch_en based on the configuration information conf stored in the FIM control register FCREG. The activation of the batch_enable signal batch_en may indicate the batch execution mode and the deactivation of the batch_enable signal batch_en may indicate the sequential execution mode.

The command-address generator CAGEN may generate the internal command-address signal CA_IN based on the internal instruction signal instr when the batch enable signal batch_en is activated. As illustrated in FIG. 20, the internal command-address signal CA_IN may be provided to the CA decoder 410 to replace the command-address signal CA provided from the host device.

The description of the bank FIM circuit BFC with reference to FIG. 10 may be applied to the configuration illustrated in FIG. 19.

FIG. 21 is a diagram illustrating example FIM instructions stored in a stacked memory device according to example embodiments.

FIG. 21 illustrates FIM instructions applied to a stacked memory device for performing one of the sequential execution mode and the batch execution mode. The descriptions repeated with FIG. 11 may be omitted.

Referring to FIG. 21, the commands transferred from the host device HOST to the stacked memory device MEM may be omitted in the batch execution mode.

In comparison with the sequential execution mode, the MOV instruction may not be used and an ACT instruction to activate memory banks and a PRE instruction to precharge the memory banks may be used additionally in the batch execution mode. In case of the ACT instruction, the bank address and the row address to be accessed may be stored in the destination field DST and the first through third source fields SRC1~SRC3. In case of the PRE instruction, the bank address to be precharged may be stored in the destination field DST. In addition, in case of some instructions, the value of the mask field MASK may be replaced by the column address.

FIG. 22 is a diagram illustrating example FIM control signals of a stacked memory device according to example embodiments. Almost of the FIM control signals in FIG. 22 are the same as described with reference to FIG. 12, and the repeated descriptions are omitted.

Referring to FIG. 22, to implement the batch execution mode, the FIM channel control circuit FCCC may further generate the hatch enable signal batch_en and the FIM end signal DONE. The activation of the batch_enable signal batch_en may indicate the batch execution mode and the deactivation of the batch_enable signal batch_en may indicate the sequential execution mode. When execution of the plurality of FIM instructions stored in the FIM front-end circuit is completed in the batch execution mode, the FIM channel control circuit FCCC may activate the FIM end signal DONE and transfer the activated FIM end signal DONE to the host device through the physical layer 310a.

In addition, to implement the batch execution mode, as described above with reference to FIG. 20, the FIM channel control circuit FCCC may further include the command-address generator CAGEN. The command-address generator CAGEN may be disabled in the sequential execution mode and enabled in the batch execution mode based on the batch enable signal batch_en. The command-address generator CAGEN may generate the internal command-address signal CA_IN based on the internal instruction signal instr in the batch execution mode.

FIGS. 23A through 24B are diagrams illustrating example operations of a stacked memory device according to example embodiments.

Figure 23B:
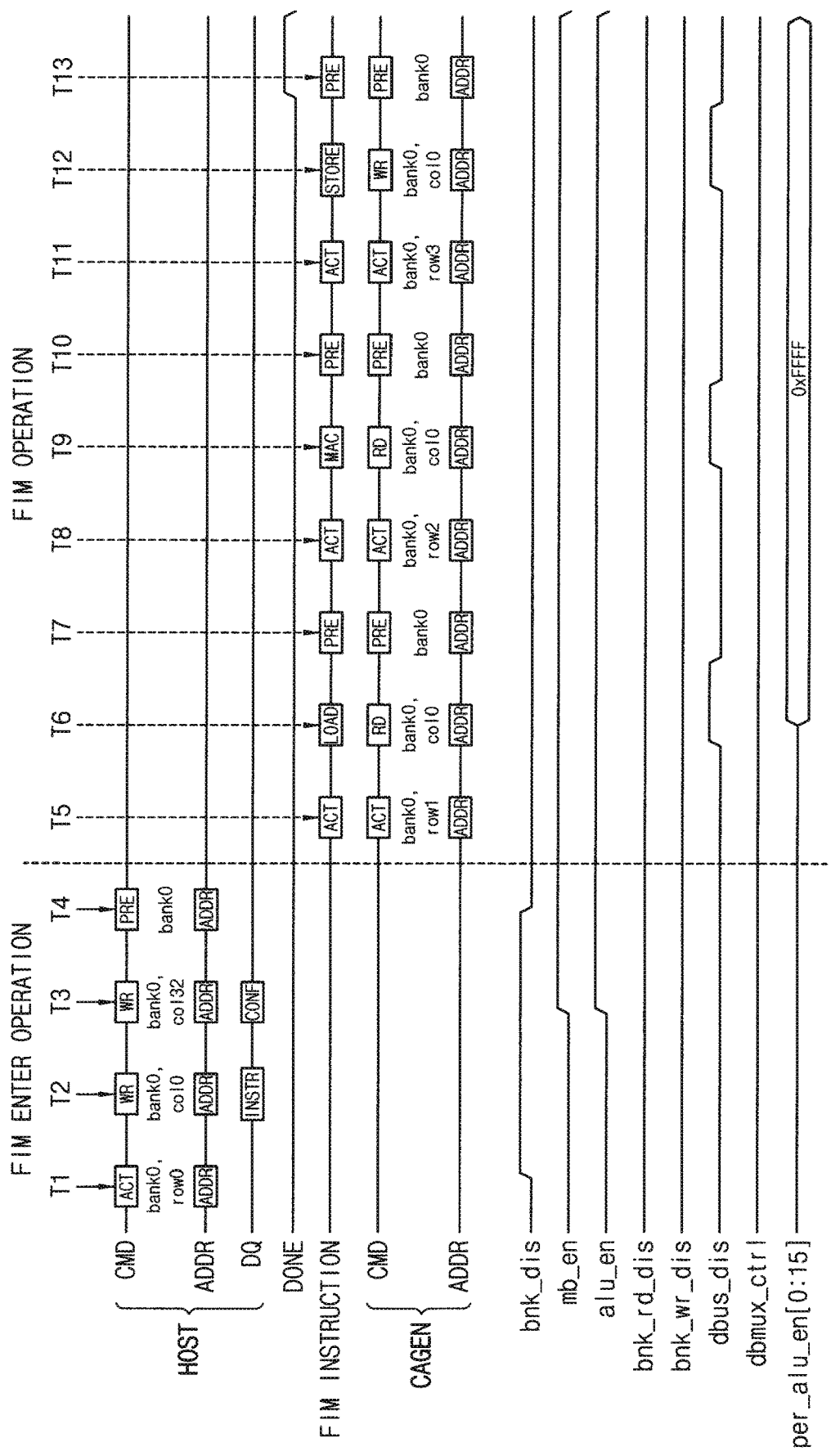

FIG. 23A illustrates an example FIM instruction sequence that sequentially includes ACT, LOAD, PRE, ACT, MAC, PRE, ACT, STORE and PRE instructions stored in the FIM instruction queue of indices 0~8, and FIG. 23B is a timing diagram illustrating an operation of a stacked memory device performing the FIM instruction sequence of FIG. 23A.

Referring to FIGS. 23A and 23B, based on the command signal CMD and the address signal ADDR transferred from the host device, the stacked memory device may perform the FIM enter operation at time points T1~T4 to convert the operation mode from the normal mode to perform the normal operation of the stacked memory device to the FIM mode to perform the FIM operation. The stacked memory device may perform the FIM operation at time points T5~T13 in the multi-bank FIM mode and in the batch execution mode. The FIM exit operation is the same as described with reference to FIG. 16B and omitted in FIG. 23B.

The stacked memory device may perform the FIM operation at time points T5~T13 in the batch execution mode to sequentially execute the plurality of FIM instructions stored in the FIM instruction queue FIMIQ in the FIM channel control circuit FCCC regardless of the command-address signal. As described above, the command-address generator CAGEN may generate the internal command-address signal CA_IN to provide the commands and the addresses to the CA decoder 410. Even though the command signal CMD and the address signal ADDR are distinct from each other in FIG. 23B, the command and the address may be provided from the host device through the command-address signal in which the command and the address are merged as described above with reference to FIGS. 7A and 7B. Also the internal command-address signal CA_IN in which the command and the address are combined may be provided from the command-address generator CAGEN to the CA decoder 410.

Referring to FIGS. 19, 20, 10, 23A and 23B, at time point T1, the FIM channel control circuit 110a may activate the bank disable signal bnk_dis based on the active command ACT, the bank address bank0 and the row address row0. While the bank disable signal bnk_dis is activated, the row decoder circuit 460 may neglect the received commands. The row address row0 may correspond to the FIM control address as described with reference to FIG. 13.

At time point T2, based on the write command WR, the bank address bank0 and the column address col0, the FIM channel control circuit 110a may receive and store the plurality of FIM instructions INSTR through the data signal DQ transferred from the host device. The column address col0 corresponds to the address of the FIM instruction queue FIMIQ.

At time point T3, based on the write command WR, the bank address bank0 and the column address col32, the FIM channel control circuit 110a may receive and store the configuration information CONF through the data signal DQ transferred from the host device. The column address col32 corresponds to the address of the FEM control register FCREG. The FIM channel control circuit 110a may activate the multi-bank enable signal mb_en and the operation circuit enable signal alu_en based on the stored configuration information CONF.

At time point T4, based on the precharge command PRE and the bank address bank0, the FIM channel control circuit 110a may deactivate the bank disable signal bnk_dis and the bank control circuit 430 may perform the precharge operation with respect to all memory banks corresponding to each channel.

The FIM operation may be performed after the FIM enter operation at time points T1~T4 is completed. The command-address generator CAGEN may be enabled because the configuration information CONF indicate the batch execution mode. At time points T5~T13, the command-address generator CAGEN may sequentially generates the commands CMD and the addresses ADDR corresponding to the FIM instructions of indices 0~8 as illustrated in FIG. 23A.

At time point T5, based on the active command ACT, the bank address bank0, the row address row1, which are generated by decoding the ACT instruction of index 0, and the activated multi-bank enable signal mb_en, the bank control circuit 430 may activate the word line corresponding to the row address row1 with respect to all memory banks.

At time point T6, based on the write command WR or the read command RD, the bank address bank0 and the column address col0, which are generated by decoding the LOAD instruction of index 1, the data may be read out from the memory banks. In the batch execution mode, the bank write disable signal bnk_wr_en and the bank read disable signal bank_rd_en may be deactivated. All of the per operation circuit enable signals per_alu_en[0:15] may be activated (0xFFFF) according to the mask value of "000000". Accordingly, the data read from the row address row1 and the column address col0 of all memory banks may be stored in the register files REGFL of all bank FIM circuits 212.

At time points T6, T9 and T12, when the read command RD or the write command WR are generated internally by the command-address generator CAGEN in the batch execution mode, the operation controller 210 may activate the data bus enable signal dbus_dis to electrically disconnect the data bus DBUS from the read-write circuit 491 and 492.

At time point T7, based on the precharge command PRE and the bank address bank0, which are generated by decoding the PRE instruction of index 2, the bank control circuit 430 may perform the precharge operation with respect to all memory banks corresponding to each channel.

At time point T8, based on the active command ACT, the bank address bank0 and the row address row2, which are generated by decoding the ACT instruction of index 3, the bank control circuit 430 may activate the word line corresponding to the row address row2 with respect to all memory banks.

At time point T9, based on the read command RD, the bank address bank0 and the column address col0, which are generated by decoding the MAC instruction of index 4, the data may be read out from all memory banks. All of the per operation circuit enable signals per_alu_en[0:15] may be activated (0xFFFF) according to the mask value of "000000". Accordingly, the operation circuit ALU corresponding to all memory banks may perform the MAC operation based on the data read from the row address row2 and the column address col0 of all memory banks and the data stored in the registers REG0 and REG32, and the processing result data may be stored in the register REG32.

At time point T10, based on the precharge command PRE and the bank address bank0, which are generated by decoding the PRE instruction of index 5, the bank control circuit 430 may perform the precharge operation with respect to all memory banks corresponding to each channel.

At time point T11, based on the active command ACT, the bank address bank0 and the row address row3, which are generated by decoding the ACT instruction of index 6, the bank control circuit 430 may activate the word line corresponding to the row address row3 with respect to all memory banks.

At time point T12, based on the write command WR, the bank address bank0 and the column address col0, which are generated by decoding the STORE instruction of index 7, the register output data corresponding to the processing result data may be provided to the write drivers 492a~492h and written in the row address row3 of all memory banks.

At time point T13, based on the precharge command PRE and the bank address bank0, which are generated by decoding the PRE instruction of index 8, the bank control circuit 430 may perform the precharge operation with respect to all memory banks corresponding to each channel.

When all of the FIM instructions stored in the FIM instruction queue FIMIQ are completed, the FIM channel control circuit 110a may activate the FIM end signal DONE and provide the FIM end signal DONE to the host device through the physical layer 310a. The host device may perform the FIM exit operation as described above in response to the activated FIM end signal DONE.

Figure 24B:
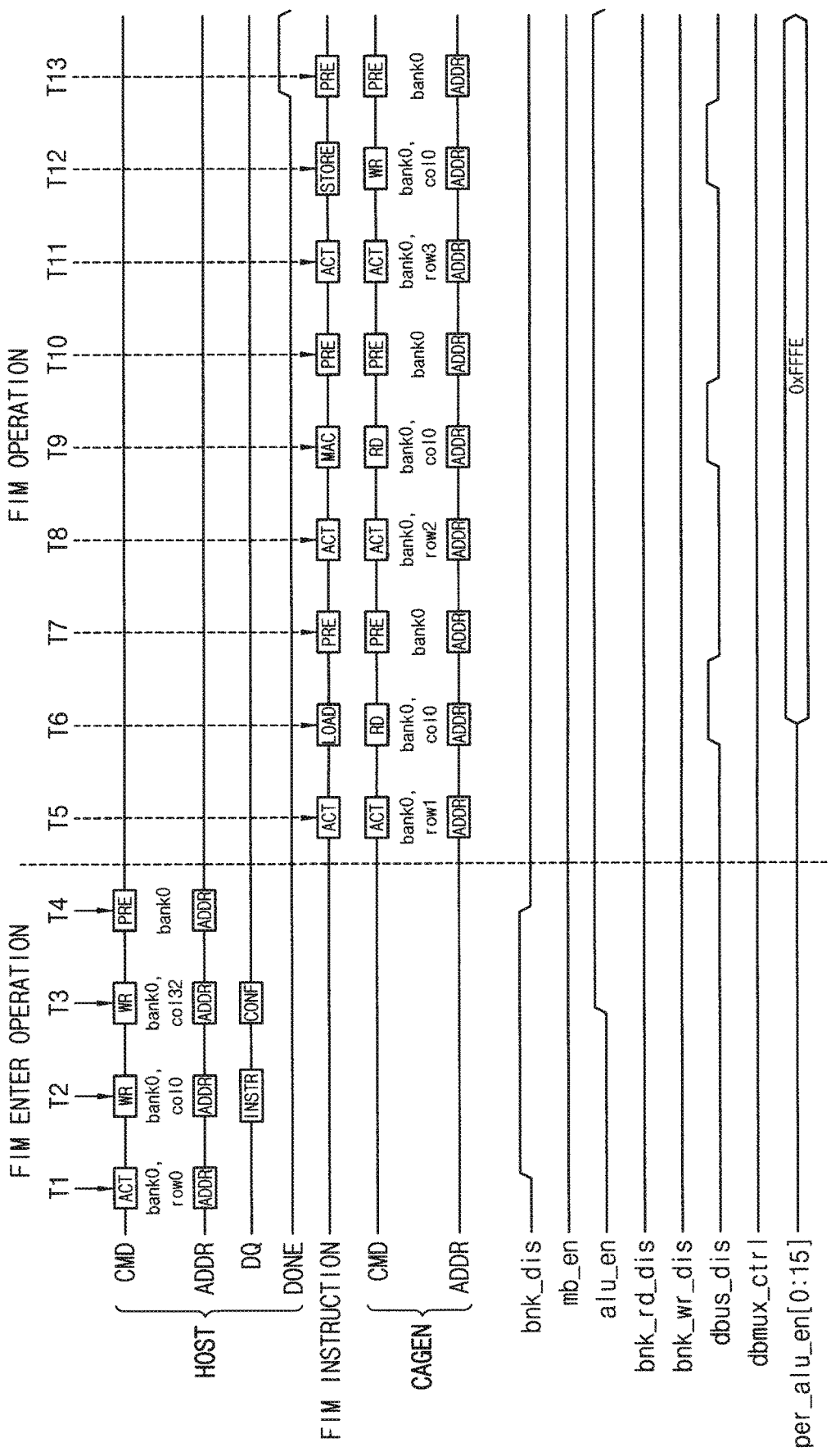

FIG. 24A illustrates an example FIM instruction sequence that sequentially includes ACT, LOAD, PRE, ACT, MAC, PRE, ACT, STORE and PRE instructions stored in the FIM instruction queue of indices 0~8, and FIG. 24B is a timing diagram illustrating an operation of a stacked memory device performing the FIM instruction sequence of FIG. 24A. Hereinafter, the descriptions repeated with FIGS. 23A and 23B are omitted.

The FIM instruction sequence of FIG. 24A is the same as the FIM instruction sequence of FIG. 23A. FIG. 24B illustrates the operation in the single-bank FIM mode whereas FIG. 23B illustrates the operation in the multi-bank FIM mode.

Referring to FIG. 24B, the multi-bank enable signal mb_en is deactivated in the single-bank FIM mode. In addition, the mask value may be neglected and only the one per operation circuit enable signal corresponding to the one memory bank may be activated (OxFFFE) in the single-bank FIM mode. Accordingly the FIM operation may be performed with respect to the one activated memory bank.

Figure 25:
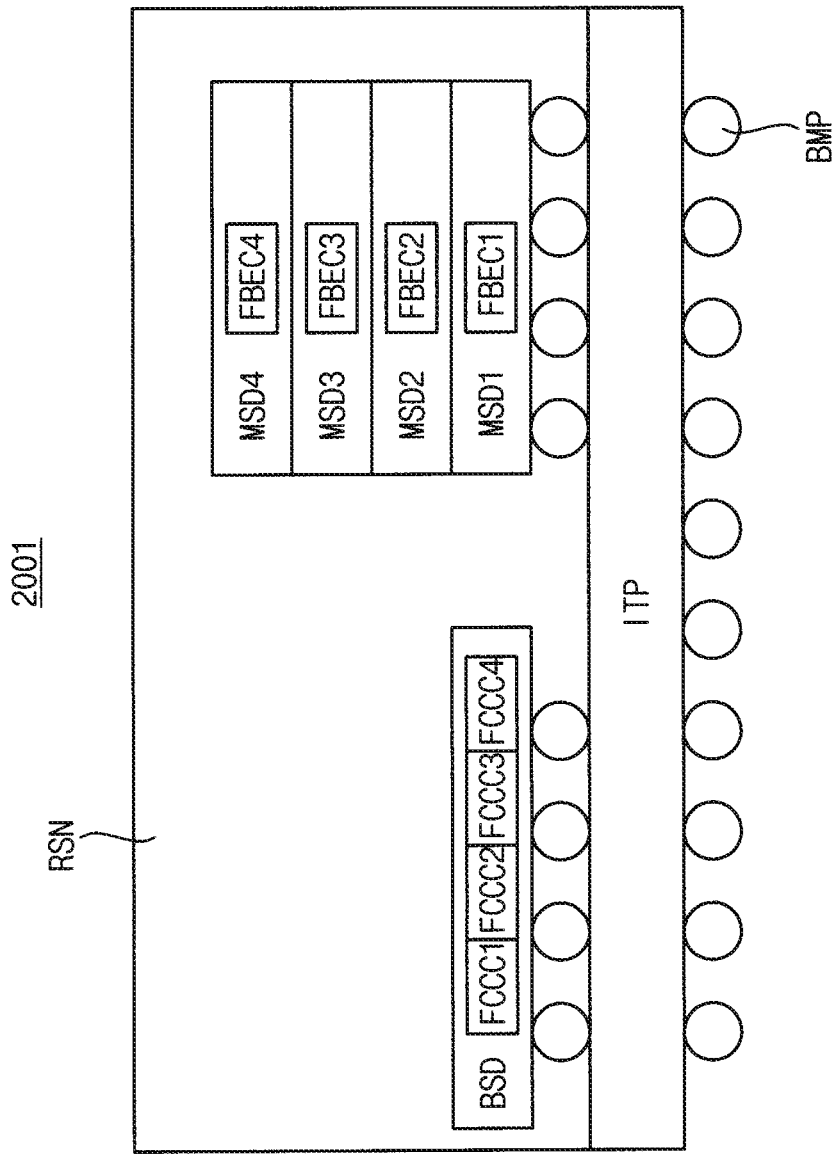
FIGS. 25 through 27 are diagrams illustrating packaging structures of a stacked memory device according to example embodiments.
Figure 26:
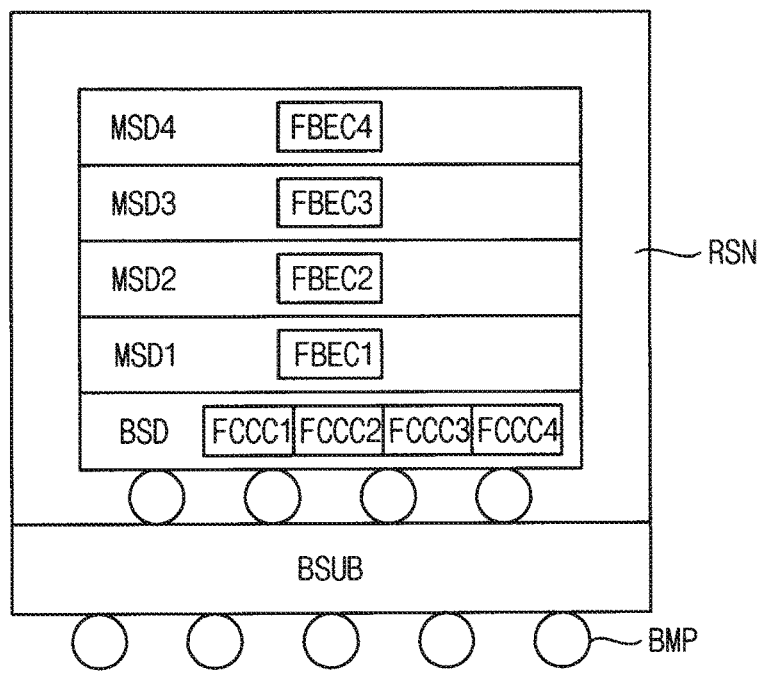
Figure 27:
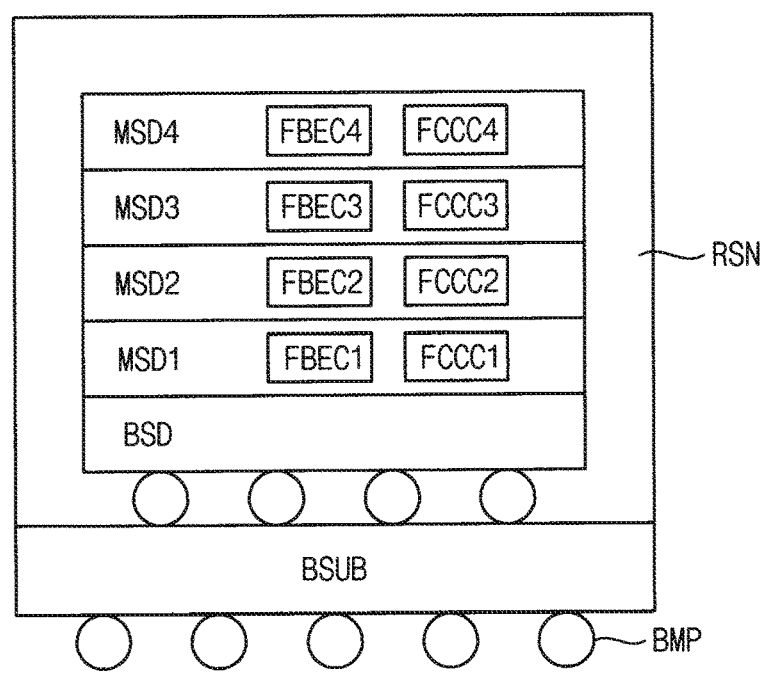

FIGS. 25 through 27 are diagrams illustrating packaging structures of a stacked memory device according to example embodiments.

Referring to FIG. 25, a memory chip 2001 may include an interposer ITP and a stacked memory device stacked on the interposer ITP. The stacked memory device may include a buffer semiconductor die BSD and a plurality of memory semiconductor dies MSD1~MSD4.

Referring to FIGS. 26 and 27, each of memory chips 2002 and 2003 may include a base substrate BSUB and a stacked memory device stacked on the base substrate BSUB. The stacked memory device may include a buffer semiconductor die BSD and a plurality of memory semiconductor dies MSD1~MSD4.

FIG. 25 illustrates a structure in which the memory semiconductor dies MSD1~MSD4 except for the buffer semiconductor die BSD are stacked vertically and the buffer semiconductor die BSD is electrically connected to the memory semiconductor dies MSD1~MSD4 through the interposer ITP or the base substrate. In contrast, FIGS. 26 and 27 illustrate a structure in which the buffer semiconductor die BSD is stacked vertically with the memory semiconductor dies MSD1~MSD4.

As illustrated in FIGS. 25 through 27, a plurality of FIM back-end circuits FBEC1~FBEC4 as described above may be formed or included in the memory semiconductor dies MSD1~MSD4.

In some example embodiments, as illustrated in FIGS. 25 and 26, a plurality of FIM channel control circuits FCCC1~FCCC4 of the FIM front-end circuit as described above may be included in the buffer semiconductor die BSD. In other example embodiments, the plurality of FIM channel control circuits FCCC1~FCCC4 may be distributed and included respectively in the memory semiconductor dies MSD1~MSD4.

FIGS. 25 through 27 illustrate example embodiments for a case that one memory semiconductor die corresponds to one channel, but example embodiments are not limited thereto. As described above, one memory semiconductor die may correspond to two or more channels and the number of the FIM back-end circuits and the number of the FIM channel control circuits included in each memory semiconductor die may be determined depending on a channel configuration.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In the example embodiment of FIG. 25, the buffer semiconductor die BSD and the memory semiconductor dies MSD1~MSD4 may be electrically connected through the through-silicon vias. The stacked semiconductor dies BSD and MSD1~MSD4 may be packaged using resin RSN.

Figure 28:
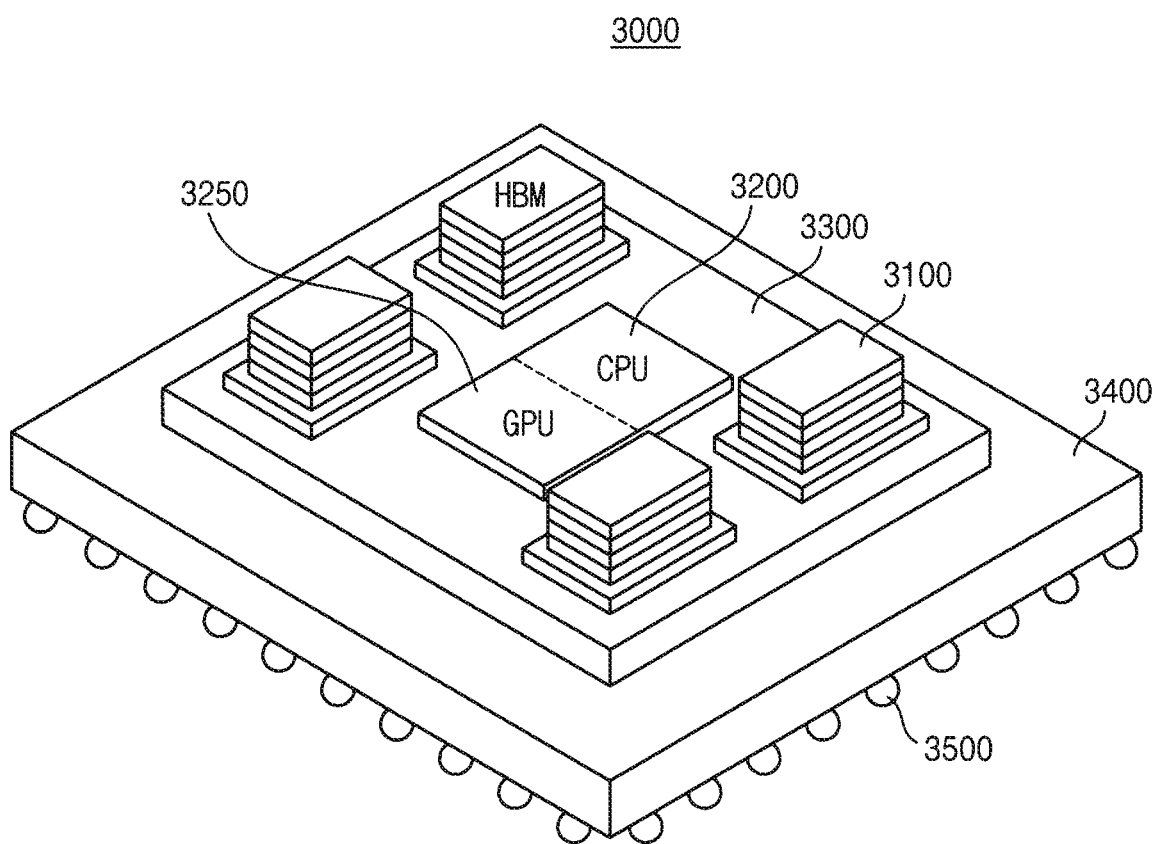
FIG. 28 is a perspective view of a semiconductor package including a stacked memory device according to example embodiments.

FIG. 28 is a perspective view of a semiconductor package including a stacked memory device according to example embodiments.

Referring to FIG. 28, a semiconductor package 3000 may include one or more stacked memory devices 3100, a central processing unit (CPU) 3200, and a graphic processing unit (GPU) 3250.

The stacked memory devices 3100, the CPU 3200 and the GPU 3250 may be mounted on an interposer 3300, and the interposer 3300 on which the stacked memory device 3100, the CPU 3200, and the GPU 3250 are mounted may be mounted on a package substrate 3400. The CPU 3200 or the GPU 3250 may be implemented to perform the function of the above-described host device. The CPU 3200 and the GPU 3250 may correspond to the CPU 2120 and the GPU 2130 in FIG. 1 respectively.

The stacked memory device 3100 may be implemented in various forms, and the stacked memory device 3100 may be a memory device in an high bandwidth memory (HBM) form in which a plurality of layers are stacked. Accordingly, the stacked memory device 3100 may include a buffer semiconductor die and a plurality of memory semiconductor dies. The buffer semiconductor die may include a FIM front-end circuit FFEC and a plurality of FIM back-end circuits according to example embodiments to perform the FIM operation efficiently.

For example, each of the stacked memory devices 3100, the CPU 3200 and the GPU 3250 may include a physical layer (PHY), and communication may be performed between the stacked memory devices 3100, the CPU 3200 and the GPU 3250 through the physical layers. When the stacked memory device 3100 includes a direct access region, a test signal may be provided into the stacked memory device 3100 through conductive means (e.g., solder balls 3500) mounted under package substrate 3400 and the direct access region.

As described above, the stacked memory device, the system and the method according to example embodiments may reduce power consumption and latency of the stacked memory device and the system by performing memory-intensive or data-intensive data processing using the FIM back-end circuit integrated in the stacked memory device. In addition, data processing time may be reduced by performing the data processing in parallel using the bank FIM circuits respectively assigned to memory banks. Further, complex data processing may be performed efficiently and performance of the system may be enhanced by storing the FIM instructions in the FIM front-end circuit and performing the FIM operation based on the stored FIM instructions.

The inventive concept may be applied to any electronic devices and systems including a memory device. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A stacked memory device comprising:
   a buffer semiconductor die configured to communicate with a host device;
   a plurality of memory semiconductor dies stacked on the buffer semiconductor die, the plurality of memory semiconductor dies comprising a plurality of memory banks;
   a plurality of through-silicon vias that electrically connect the buffer semiconductor die and the plurality of memory semiconductor dies;
   a function-in-memory (FIM) front-end circuit configured to receive a plurality of FIM instructions for a FIM operation from the host device and store the plurality of FIM instructions, wherein the FIM operation comprises data processing based on internal data read from the plurality of memory banks; and
   a plurality of FIM back-end circuits in respective ones of the plurality of memory semiconductor dies, wherein the plurality of FIM back-end circuits are configured to perform the FIM operation corresponding to the plurality of FIM instructions stored in the FIM front-end circuit under control of the FIM front-end circuit,
   wherein the FIM front-end circuit is configured to convert an operation mode from a normal mode to perform a normal operation of the stacked memory device to a FIM mode to perform the FIM operation or configured to convert from the FIM mode to the normal mode based on a command-address signal transferred from the host device.

2. The stacked memory device of claim 1, wherein the FIM front-end circuit is configured to receive the plurality of FIM instructions through a data signal transferred from the host device when the FIM front-end circuit converts the operation mode from the normal mode to the FIM mode.

3. The stacked memory device of claim 1, wherein the FIM front-end circuit is configured to receive configuration information to control the plurality of FIM back-end circuits through a data signal transferred from the host device when the FIM front-end circuit converts the operation mode from the normal mode to the FIM mode.

4. The stacked memory device of claim 3, wherein, when the configuration information indicates a sequential execution mode, the FIM front-end circuit is configured to execute one FIM instruction among the plurality of FIM instructions stored in the FIM front-end circuit based on the command-address signal, wherein the one FIM instruction corresponds to one command and one address included in the command-address signal.

5. The stacked memory device of claim 3, wherein, when the configuration information indicates a batch execution mode, the FIM front-end circuit sequentially is configured to execute the plurality of FIM instructions stored in the FIM front-end circuit regardless of the command-address signal.

6. The stacked memory device of claim 5, wherein, when execution of the plurality of FIM instructions stored in the FIM front-end circuit is completed in the batch execution mode, the FIM front-end circuit is configured to generate a FIM end signal and transfer the FIM end signal to the host device.

7. The stacked memory device of claim 5, wherein the FIM front-end circuit is configured to generate an internal command-address signal to control the plurality of memory banks based on the plurality of FIM instructions stored in the FIM front-end circuit in the batch execution mode.

8. The stacked memory device of claim 1,
   wherein the plurality of memory banks form a plurality of channels that are accessed independently by the host device, and
   wherein the FIM front-end circuit comprises a plurality of FIM channel control circuits configured to control the FIM operation of respective memory banks corresponding to each channel among the plurality of channels.

9. The stacked memory device of claim 8, wherein all of the plurality of FIM channel control circuits are included in the buffer semiconductor die.

10. The stacked memory device of claim 8, wherein each of the plurality of FIM channel control circuits is included in a memory semiconductor die comprising memory banks corresponding to each channel among the plurality of channels.

11. The stacked memory device of claim 8, wherein each of the plurality of FIM channel control circuits comprises:
    a FIM decoder configured to decode a command-address signal transferred from the host device to generate an internal command signal and an internal address signal;
    a FIM controller configured to generate a queue control signal based on the internal command signal and the internal address signal;
    a FIM instruction queue configured to store the FIM instructions included in a data signal transferred from the host device and output stored FIM instructions based on the queue control signal; and
    a FIM instruction decoder configured to decode the FIM instructions output from the FIM instruction queue to generate an internal instruction signal and transfer the internal instruction signal to a FIM back-end circuit corresponding to each channel.

12. The stacked memory device of claim 11, wherein the FIM controller comprises:
a FIM control register configured to store configuration information included in the data signal from the host device based on the internal command signal and the internal address signal,
wherein the FIM controller generates FIM channel control signals to control a FIM back-end circuit corresponding to each channel, based on the configuration information stored in the FIM control register.

13. The stacked memory device of claim 12,
wherein the FIM channel control signals comprises a multi-bank enable signal,
wherein the FIM back-end circuit corresponding to each channel is configured to perform the FIM operation in a same clock cycle with respect to memory banks corresponding to each channel when the multi-bank enable signal is activated, and
wherein the FIM back-end circuit corresponding to each channel is configured to perform the FIM operation with respect to one of the memory banks corresponding to each channel when the multi-bank enable signal is deactivated.

14. The stacked memory device of claim 12, wherein the host device is configured to assign a portion of a system address space to set a FIM control address indicating the FIM instruction queue and the FIM control register, and is configured to control read and write operation of the FIM instructions and the configuration information using the FIM control address and commands for a normal operation of the stacked memory device.

15. The stacked memory device of claim 11, wherein the FIM back-end circuit corresponding to each channel comprises:
a plurality of bank FIM circuits associated with respective ones of the memory banks, wherein ones of the plurality of bank FIM circuits are configured to perform the FIM operation on the respective ones of the memory banks; and
an operation controller configured to generate FIM die control signals to control the plurality of bank FIM circuits based on an internal instruction signal and FIM channel control signals corresponding to the plurality of FIM instructions, wherein the internal instruction signal and the FIM channel control signals are provided from the respective ones of the plurality of FIM channel control circuits.

16. The stacked memory device of claim 15, wherein each of the plurality of bank FIM circuits comprises:
an operation circuit configured to perform the data processing to generate processing result data;
a register file configured to store the processing result data provided from the operation circuit; and
a data path control circuit configured to control connections between an input of the operation circuit, an output of the register file, a memory bank and a data bus configured to communicate with the buffer semiconductor die.

17. The stacked memory device of claim 1, wherein the stacked memory device comprises a high bandwidth memory (HBM) device.

18. A system comprising:
a stacked memory device; and
a host device configured to control the stacked memory device,
wherein the stacked memory device comprises:
a buffer semiconductor die configured to communicate with the host device;
a plurality of memory semiconductor dies stacked on the buffer semiconductor die, the plurality of memory semiconductor dies comprising a plurality of memory banks;
a plurality of through-silicon vias that electrically connect the buffer semiconductor die and the plurality of memory semiconductor dies;
a function-in-memory (FIM) front-end circuit configured to receive a plurality of FIM instructions for a FIM operation from the host device and store the plurality of FIM instructions, wherein the FIM operation comprises data processing based on internal data read from the plurality of memory banks; and
a plurality of FIM back-end circuits in respective ones of the plurality of memory semiconductor dies, wherein the plurality of FIM back-end circuits are configured to perform the FIM operation corresponding to the plurality of FIM instructions stored in the FIM front-end circuit under control of the FIM front-end circuit,
wherein the FIM front-end circuit is configured to convert an operation mode from a normal mode to perform a normal operation of the stacked memory device to a FIM mode to perform the FIM operation or configured to convert from the FIM mode to the normal mode based on a command-address signal transferred from the host device.

19. A method of operating a stacked memory device comprising a buffer semiconductor die that is configured to communicate with a host device and a plurality of memory semiconductor dies comprising a plurality of memory banks, wherein the buffer semiconductor die and the plurality of memory semiconductor dies are stacked, the method comprising:
transferring a plurality of function-in-memory (FIM) instructions for a FIM operation from a host device to the stacked memory device, wherein the FIM operation comprises data processing based on internal data read from a plurality of memory banks;
storing the plurality of FIM instructions in a FIM front-end circuit that is in the buffer semiconductor die or in the plurality of memory semiconductor dies; and
performing the FIM operation corresponding to the FIM instructions stored in the FIM front-end circuit under control of the FIM front-end circuit, using a plurality of FIM back-end circuits included in respective ones of the plurality of memory semiconductor dies,
wherein the FIM front-end circuit is configured to convert an operation mode from a normal mode to perform a normal operation of the stacked memory device to a FIM mode to perform the FIM operation or configured to convert from the FIM mode to the normal mode based on a command-address signal transferred from the host device.

* * * * *